US012701997B2

(12) United States Patent
Kwon

(10) Patent No.: US 12,701,997 B2
(45) Date of Patent: Aug. 4, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventor: Yonghwan Kwon, Suwon-si (KR)

(73) Assignee: Samsung Electronics Co., Ltd., Gyeonggi-do (KR)

(\*) Notice: Subject to any disclaimer, the term of this patent is extended or adjusted under 35 U.S.C. 154(b) by 471 days.

(21) Appl. No.: 18/311,597

(22) Filed: May 3, 2023

(65) Prior Publication Data

US 2024/0105541 A1     Mar. 28, 2024

(30) Foreign Application Priority Data

Sep. 22, 2022    (KR) ........................ 10-2022-0119909

(51) Int. Cl.
 *H10W 40/22*      (2026.01)
 *H10W 20/20*      (2026.01)
  (Continued)

(52) U.S. Cl.
 CPC ........... *H10W 40/22* (2026.01); *H10W 20/20* (2026.01); *H10W 40/258* (2026.01);
  (Continued)

(58) Field of Classification Search
 CPC . H01L 23/367; H01L 23/3736; H01L 23/481; H01L 23/49811; H10W 40/22;
  (Continued)

(56) References Cited

U.S. PATENT DOCUMENTS 8,592,932 B2 * 11/2013 Andry ..................... H10P 72/74
                                                    257/434
8,957,525 B2 * 2/2015 Lyne ..................... H10W 90/00
                                                    257/777
(Continued)

FOREIGN PATENT DOCUMENTS

CN       111199927 A  *  5/2020  ............ H10W 90/00
CN       113327915 A  *  8/2021  .......... H10W 90/401
    (Continued)

OTHER PUBLICATIONS

Korean Office Action and English Statement for corresponding Korean Application No. 10-2022-0119909 dated May 14, 2026.

*Primary Examiner* — Laura M Menz
(74) *Attorney, Agent, or Firm* — Harness, Dickey & Pierce, P.L.C.

(57) ABSTRACT

A semiconductor package includes a first redistribution wiring layer including a first redistribution wiring layer having a plurality of first redistribution wires, and a plurality of first bonding pads electrically connected to the first redistribution wires and exposed from a lower surface, a first semiconductor substrate on an upper surface of the plurality of first redistribution wiring layer, the first semiconductor substrate having at least one first semiconductor chip and through vias that are electrically connected to the first redistribution wires, and the first semiconductor substrate having a first heat dissipation structure that surrounds an outer surface of the first semiconductor chip, a second redistribution wiring layer on the first semiconductor substrate, and the second redistribution having a plurality of second redistribution wires that are electrically connected to the through vias, and a second semiconductor substrate having at least one second semiconductor chip that is electrically connected to the plurality of second redistribu-
(Continued)

tion wires, and a second heat dissipation structure surrounding an outer surface of the second semiconductor chip.

18 Claims, 34 Drawing Sheets

(51) Int. Cl.

| | |
|---|---|
| *H10W 40/25* | (2026.01) |
| *H10W 70/60* | (2026.01) |
| *H10W 70/685* | (2026.01) |
| *H10W 90/00* | (2026.01) |

(52) U.S. Cl.
CPC ........ *H10W 70/611* (2026.01); *H10W 70/685* (2026.01); *H10W 90/00* (2026.01); *H10W 90/701* (2026.01); *H10W 90/794* (2026.01)

(58) Field of Classification Search
CPC . H10W 20/20; H10W 40/258; H10W 70/611; H10W 70/685
See application file for complete search history.

(56) References Cited

U.S. PATENT DOCUMENTS

| | | | | |
|---|---|---|---|---|
| 9,159,602 | B2 | 10/2015 | Andry et al. | |
| 9,322,901 | B2 | 4/2016 | Kerness et al. | |
| 9,674,945 | B2 | 6/2017 | Teh et al. | |
| 9,691,747 | B1 | 6/2017 | Dang et al. | |
| 9,735,077 | B1 | 8/2017 | Chen et al. | |
| 10,658,335 | B2 | 5/2020 | Gu et al. | |
| 10,756,010 | B2 * | 8/2020 | Yu | H10P 72/74 |
| 11,133,283 | B2 | 9/2021 | Wu et al. | |
| 11,450,632 | B2 * | 9/2022 | Kang | H10W 70/60 |
| 11,735,542 | B2 * | 8/2023 | Kang | H10W 70/60 |
| | | | | 257/734 |
| 11,735,553 | B2 * | 8/2023 | Lee | H10P 72/74 |
| | | | | 257/774 |
| 12,040,299 | B2 * | 7/2024 | Lee | H10P 72/74 |
| 12,315,824 | B2 * | 5/2025 | Kwon | H10W 42/121 |
| 2008/0217761 | A1 * | 9/2008 | Yang | H10W 70/093 |
| | | | | 257/737 |
| 2011/0186998 | A1 * | 8/2011 | Wu | H10W 70/095 |
| | | | | 257/738 |
| 2012/0074566 | A1 * | 3/2012 | Youn | H10W 72/019 |
| | | | | 257/734 |
| 2016/0118326 | A1 * | 4/2016 | Kwon | H10W 70/095 |
| | | | | 257/621 |
| 2017/0170154 | A1 * | 6/2017 | Ryu | H10W 90/00 |
| 2018/0005991 | A1 * | 1/2018 | Seidemann | H10W 90/00 |
| 2018/0166427 | A1 * | 6/2018 | Chen | H10W 90/00 |
| 2020/0006305 | A1 | 1/2020 | Lambert et al. | |
| 2020/0105676 | A1 * | 4/2020 | Jin | H10P 72/74 |
| 2020/0286871 | A1 | 9/2020 | Liff et al. | |
| 2020/0373243 | A1 * | 11/2020 | Jang | H10W 70/09 |
| 2020/0395306 | A1 | 12/2020 | Chen et al. | |
| 2020/0395313 | A1 | 12/2020 | Mallik et al. | |
| 2021/0028147 | A1 | 1/2021 | Yu et al. | |
| 2021/0134704 | A1 | 5/2021 | Chen et al. | |
| 2021/0183785 | A1 * | 6/2021 | Kwon | H10W 70/614 |
| 2021/0335736 | A1 * | 10/2021 | Kang | H10W 70/60 |
| 2021/0343680 | A1 | 11/2021 | Yeh et al. | |
| 2022/0068896 | A1 * | 3/2022 | Kwon | H10W 90/00 |
| 2022/0102256 | A1 * | 3/2022 | Kwon | H10W 90/701 |
| 2022/0108968 | A1 | 4/2022 | Kim et al. | |
| 2022/0293569 | A1 * | 9/2022 | Fay | H10W 90/00 |
| 2022/0384322 | A1 * | 12/2022 | Kwon | H10W 90/701 |

| | | | | |
|---|---|---|---|---|
| 2023/0014987 | A1 * | 1/2023 | Kang | H10W 70/60 |
| 2023/0023672 | A1 * | 1/2023 | Kwon | H10W 42/121 |
| 2023/0299049 | A1 * | 9/2023 | Deshpande | H10W 90/00 |
| 2023/0352432 | A1 * | 11/2023 | Lee | H10P 72/74 |
| 2023/0378016 | A1 * | 11/2023 | Huang | H10W 20/20 |
| 2024/0014115 | A1 * | 1/2024 | Chen | H10W 70/611 |
| 2024/0055362 | A1 * | 2/2024 | Kwon | H10W 46/00 |
| 2024/0063131 | A1 * | 2/2024 | Lee | H10P 72/74 |
| 2024/0071996 | A1 * | 2/2024 | Seo | H10B 80/00 |
| 2024/0087983 | A1 * | 3/2024 | Heo | H10W 40/70 |
| 2024/0105541 | A1 * | 3/2024 | Kwon | H10W 40/22 |
| 2024/0162130 | A1 * | 5/2024 | Park | H10W 70/614 |
| 2024/0170382 | A1 * | 5/2024 | Oh | H10W 70/614 |
| 2024/0234287 | A9 * | 7/2024 | Kim | H10W 40/228 |
| 2024/0332150 | A1 * | 10/2024 | Park | H10W 40/22 |
| 2024/0421061 | A1 * | 12/2024 | Kim | H10W 90/401 |
| 2024/0429110 | A1 * | 12/2024 | Lee | H10W 76/40 |
| 2025/0038081 | A1 * | 1/2025 | Park | H10W 74/111 |
| 2025/0046756 | A1 * | 2/2025 | Hsiao | H10W 70/685 |
| 2025/0062183 | A1 * | 2/2025 | Hyung | H10W 40/228 |
| 2025/0096099 | A1 * | 3/2025 | Kim | H10W 70/65 |
| 2025/0149466 | A1 * | 5/2025 | Lee | H10W 42/121 |
| 2025/0149515 | A1 * | 5/2025 | Lee | H10W 70/685 |
| 2025/0167089 | A1 * | 5/2025 | Moon | H10W 70/635 |
| 2025/0210502 | A1 * | 6/2025 | Kim | H10W 70/65 |
| 2025/0210593 | A1 * | 6/2025 | Hsu | H10W 90/00 |
| 2025/0253297 | A1 * | 8/2025 | Chung | H10W 70/68 |
| 2025/0266370 | A1 * | 8/2025 | Chung | H10W 42/20 |
| 2025/0266371 | A1 * | 8/2025 | Kwon | H10W 42/121 |
| 2025/0273577 | A1 * | 8/2025 | Choi | H10W 70/60 |
| 2025/0279404 | A1 * | 9/2025 | Jung | H10W 70/685 |
| 2025/0300068 | A1 * | 9/2025 | Choi | H10W 20/42 |
| 2025/0336752 | A1 * | 10/2025 | Huang | H10W 20/20 |

FOREIGN PATENT DOCUMENTS

| | | | | | |
|---|---|---|---|---|---|
| CN | 114783984 | A | * | 7/2022 | H10W 20/20 |
| CN | 217691145 | U | * | 10/2022 | |
| CN | 115497912 | A | * | 12/2022 | H10W 70/618 |
| CN | 110838473 | B | * | 5/2023 | H10W 90/00 |
| CN | 117352463 | A | * | 1/2024 | H10W 70/611 |
| CN | 119028950 | A | * | 11/2024 | H10W 74/114 |
| CN | 120072796 | A | * | 5/2025 | H10W 90/00 |
| CN | 120674393 | A | * | 9/2025 | H10W 72/90 |
| EP | 3131117 | A1 | * | 2/2017 | H10W 72/0198 |
| EP | 4187592 | A1 | * | 5/2023 | H10W 70/24 |
| JP | 2025141806 | A | * | 9/2025 | H10W 90/701 |
| KR | 20120135897 | A | | 12/2012 | |
| KR | 20160012589 | A | * | 2/2016 | H10W 74/121 |
| KR | 20170112343 | A | * | 10/2017 | H10W 76/40 |
| KR | 20180060896 | A | | 6/2018 | |
| KR | 20190140160 | A | * | 12/2019 | H10W 90/00 |
| KR | 20220102542 | A | | 7/2022 | |
| KR | 102442623 | B1 | | 9/2022 | |
| KR | 20220128587 | A | * | 9/2022 | H10W 72/90 |
| KR | 20230006326 | A | * | 1/2023 | H10W 70/65 |
| KR | 20230016723 | A | * | 2/2023 | H10W 20/212 |
| KR | 20240040962 | A | * | 3/2024 | H10W 90/701 |
| KR | 20240078441 | A | * | 6/2024 | H10W 90/00 |
| KR | 20240175907 | A | * | 12/2024 | H10W 90/00 |
| KR | 20250018190 | A | * | 2/2025 | H10W 70/09 |
| KR | 20250027373 | A | * | 2/2025 | H10W 90/401 |
| KR | 102843286 | B1 | * | 8/2025 | H10W 72/0198 |
| KR | 20250122615 | A | * | 8/2025 | H10W 90/401 |
| KR | 20250126879 | A | * | 8/2025 | H10W 90/00 |
| KR | 102881292 | B1 | * | 11/2025 | H10W 20/42 |
| WO | WO-2020134665 | A1 | * | 7/2020 | H03H 3/08 |
| WO | WO-2024108906 | A1 | * | 5/2024 | H10W 72/00 |
| WO | WO-2024108906 | A9 | * | 7/2024 | H10W 72/00 |

* cited by examiner

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2022-0119909, filed on Sep. 22, 2022 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including a plurality of stacked different semiconductor substrates and a method of manufacturing the same.

2. Description of the Related Art

In a multi-chip package technology, a plurality of semiconductor chips may be mounted on a semiconductor substrate to be spaced apart in a horizontal direction, and the plurality of semiconductor chips may be covered by a sealing member. As functions required of a semiconductor package increase, the number of semiconductor chips may increase. In some example embodiments, there may be a problem of space utilization because a thickness and/or a size of the semiconductor package increase and semiconductor chips may not be stacked in a vertical direction. As a density of semiconductor chips increases, heat problems may occur.

SUMMARY

Example embodiments provide a semiconductor package including a structure capable of increasing space utilization and/or dissipating heat.

Example embodiments provide a method of manufacturing the semiconductor package.

According to example embodiments, a semiconductor package includes a first redistribution wiring layer including a first redistribution wiring layer having a plurality of first redistribution wires, and a plurality of first bonding pads electrically connected to the plurality of first redistribution wires and exposed from a lower surface, a first semiconductor substrate on an upper surface of the first redistribution wiring layer, the first semiconductor substrate having at least one first semiconductor chip and through vias that are electrically connected to the plurality of first redistribution wires, and the first semiconductor substrate having a first heat dissipation structure surrounding an outer surface of the first semiconductor chip, a second redistribution wiring layer on the first semiconductor substrate, and the second redistribution having a plurality of second redistribution wires that are electrically connected to the through vias, and a second semiconductor substrate having at least one second semiconductor chip that is electrically connected to the second redistribution wires, and a second heat dissipation structure surrounding an outer surface of the second semiconductor chip.

According to example embodiments, in a method of manufacturing a semiconductor package, a first sub package having first and second surfaces opposed to each other is formed. A second sub package having third and fourth surfaces opposite to each other is formed. Third bonding pads that are exposed from the fourth surface of the second sub package are bonded to second bonding pads that are exposed from the first surface of the first sub package. In a process that the first sub package is formed, a plurality of first openings and at least one first cavity are formed. The first openings vertically penetrate a first semiconductor substrate that has first upper and first lower surfaces opposed to each other. At least one first heat dissipation structure and through vias are formed. The first heat dissipation structure covers an outer surface of at least one first semiconductor chip that is in the first cavity. The through vias are inserted into the first openings, respectively. A first redistribution wiring layer having first bonding pads is formed on the first lower surface of the first semiconductor substrate such that the first bonding pads electrically connected to the first semiconductor chip and the through vias through a plurality of first redistribution wires are exposed to the second surface. A second redistribution wiring layer having second bonding pads is formed on the first upper surface of the first semiconductor substrate such that the second bonding pads electrically connected to the through vias through a plurality of second redistribution wires are exposed to the first surface. In a process that the second sub package is formed, at least one second cavity penetrates a second semiconductor substrate in a vertical direction. The second semiconductor substrate has second upper and second lower surfaces opposite to each other. At least one second heat dissipation structure covers an outer surface of at least one second semiconductor chip in the second cavity. A third redistribution wiring layer having third bonding pads is formed on the second lower surface of the second semiconductor substrate such that the third bonding pads electrically connected to the second semiconductor chip through a plurality of third redistribution wires are exposed on the fourth surface.

According to example embodiments, in a method of manufacturing a semiconductor package, a first sub package having first and second surfaces opposed to each other is formed. A second sub package having third and fourth surfaces opposite to each other is formed. Third bonding pads that are exposed from the fourth surface of the second sub package are bonded to second bonding pads that are exposed from the first surface of the first sub package. In a process that the first sub package is formed, a plurality of first openings and at least one first cavity are formed. The first openings vertically penetrate a first semiconductor substrate that has first upper and first lower surfaces opposed to each other. At least one first heat dissipation structure and through vias are formed. The first heat dissipation structure covers an outer surface of at least one first semiconductor chip that is in the first cavity. The through vias are inserted into the first openings, respectively. A first redistribution wiring layer having first bonding pads is formed on the first lower surface of the first semiconductor substrate such that the first bonding pads electrically connected to the first semiconductor chip and the through vias through a plurality of first redistribution wires are exposed to the second surface. A second redistribution wiring layer having second bonding pads is formed on the first upper surface of the first semiconductor substrate such that the second bonding pads electrically connected to the through vias through a plurality of second redistribution wires are exposed to the first surface. In a process that the second sub package is formed, at least one second cavity penetrates a second semiconductor substrate in a vertical direction. The second semiconductor substrate has second upper and second lower surfaces opposite to each other. At least one second heat dissipation structure covers an outer surface of at least one second semiconductor chip accommodated in the second cavity. A third redistribution wiring layer having third bonding pads is formed on the second lower surface of the second semiconductor substrate such that the third bonding pads electrically connected to the second semiconductor chip through a plurality of third redistribution wires are exposed on the fourth surface. In a process that the first heat dissipation structure and through vias are formed, the first semiconductor chip is within the first cavity. The through vias are formed by injecting a conductive material into the first openings. The first heat dissipation structure is formed by injecting the conductive material between the first cavity and the first semiconductor chip. In a process that the second heat dissipation structure is formed, the second semiconductor chip is within the second cavity. The second heat dissipation structure is formed by injecting a conductive material between the second cavity and the second semiconductor chip. The first and second heat dissipation structures are electrically insulated from the first and second semiconductor chips.

According to example embodiments, a semiconductor package may include a first redistribution wiring layer including a first redistribution wiring layer having a plurality of first redistribution wires, and a plurality of first bonding pads electrically connected to the first redistribution wires and exposed from a lower surface, a first semiconductor substrate on an upper surface of the first redistribution wiring layer, the first semiconductor substrate having at least one first semiconductor chip and through vias that are electrically connected to the first redistribution wires, and the first semiconductor substrate having a first heat dissipation structure that surrounds an outer surface of the first semiconductor chip, a second redistribution wiring layer on the first semiconductor substrate, and the second redistribution having a plurality of second redistribution wires that are electrically connected to the through vias, and a second semiconductor substrate having at least one second semiconductor chip that is electrically connected to the second redistribution wires, and a second heat dissipation structure that is surrounding an outer surface of the second semiconductor chip.

Thus, the first sub package having the first semiconductor chip may be bonded to the third bonding pads that are exposed from the fourth surface of the second sub package having the second semiconductor chip via the second bonding pads exposed from the first surface. The first and second semiconductor chips may be electrically connected to each other through second and third redistribution wiring layers that are bonded to each other through second and third bonding pads. Since the first and second semiconductor chips are stacked in a vertical direction through the second and third redistribution wiring layers, space utilization may be increased. Since the first and second semiconductor chips are accommodated in the first and second cavities of the first and second semiconductor substrates, respectively, the first and second semiconductor chips may be accommodated in various positions in accordance with a required package structure.

Also, the first and second heat dissipation structures covering the outer surfaces of the first and second semiconductor chips, respectively may include conductive materials such as the through vias. The first and second heat dissipation structures may dissipate heat from the first and second semiconductor chips. The first and second heat dissipation structures may be provided inside the first and second semiconductor substrates, respectively to reduce or prevent warpage that occurs in the first and second semiconductor substrates. Since the first and second heat dissipation structures are simultaneously formed during a process of forming the through vias electrically connecting the first and second redistribution wiring layers to each other, the first and second heat dissipation structures may be formed without the addition of a complicated process.

BRIEF DESCRIPTION OF THE DRAWINGS

Example embodiments will be more clearly understood from the following detailed description taken in conjunction with the accompanying drawings. FIGS. 1 to 34 represent non-limiting, example embodiments as described herein.

FIG. 1 is a cross-sectional view illustrating a semiconductor package in accordance with example embodiments.

FIG. 2 is a plan view illustrating a first semiconductor substrate in FIG. 1.

FIG. 3 is a plan view illustrating a second semiconductor substrate in FIG. 1.

FIGS. 4 to 26 are views illustrating a method of manufacturing a semiconductor package in accordance with example embodiments.

FIG. 27 is a cross-sectional view illustrating a semiconductor package including a conductive connector in accordance with example embodiments.

FIGS. 28 to 33 are views illustrating a method of manufacturing a semiconductor package in accordance with example embodiments.

FIG. 34 is a cross-sectional view illustrating a semiconductor package including conductive wires in accordance with example embodiments.

DETAILED DESCRIPTION OF EXAMPLE EMBODIMENTS

Hereinafter, example embodiments will be explained in detail with reference to the accompanying drawings.

Figure 1:
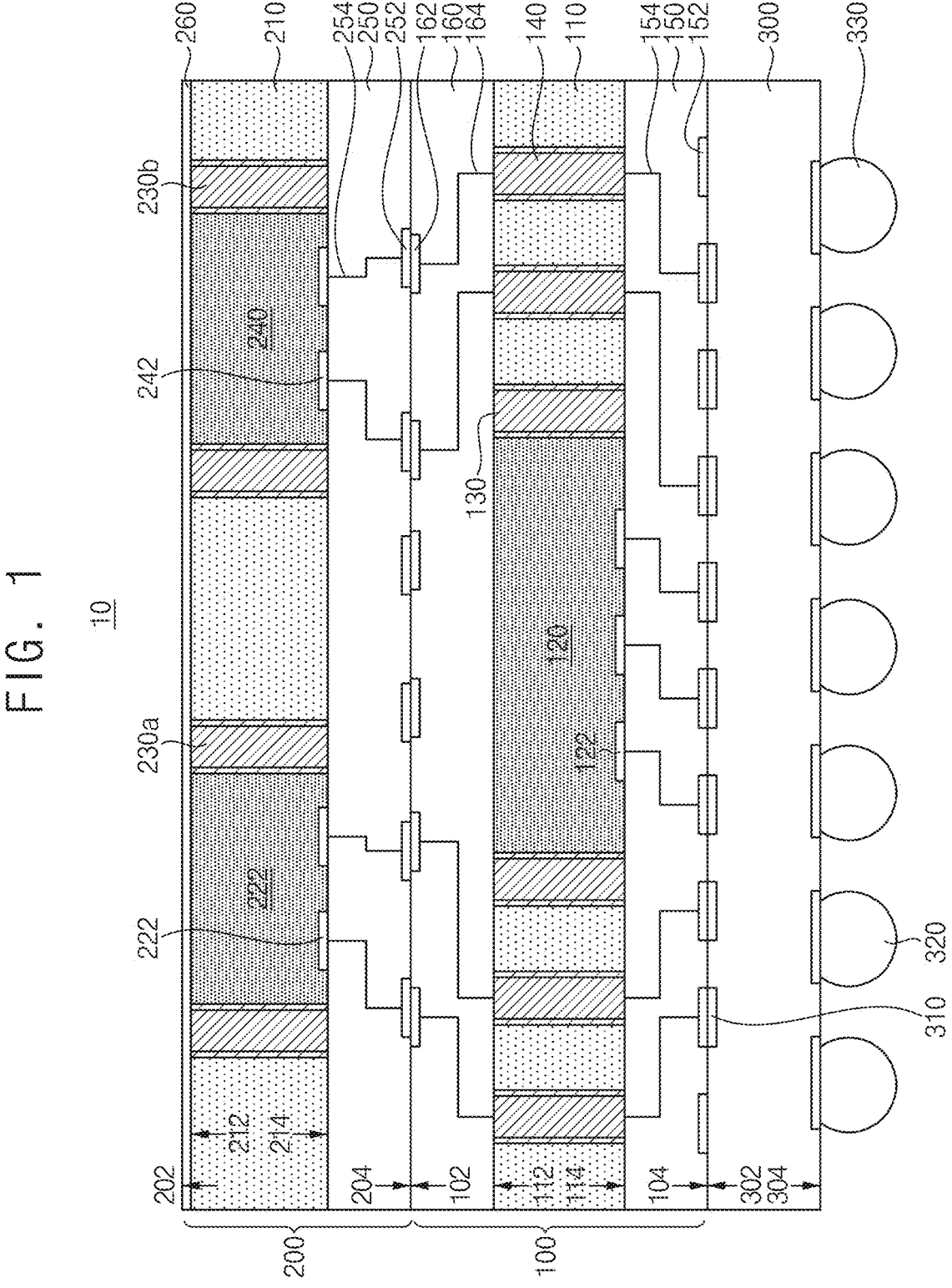
Figure 2:
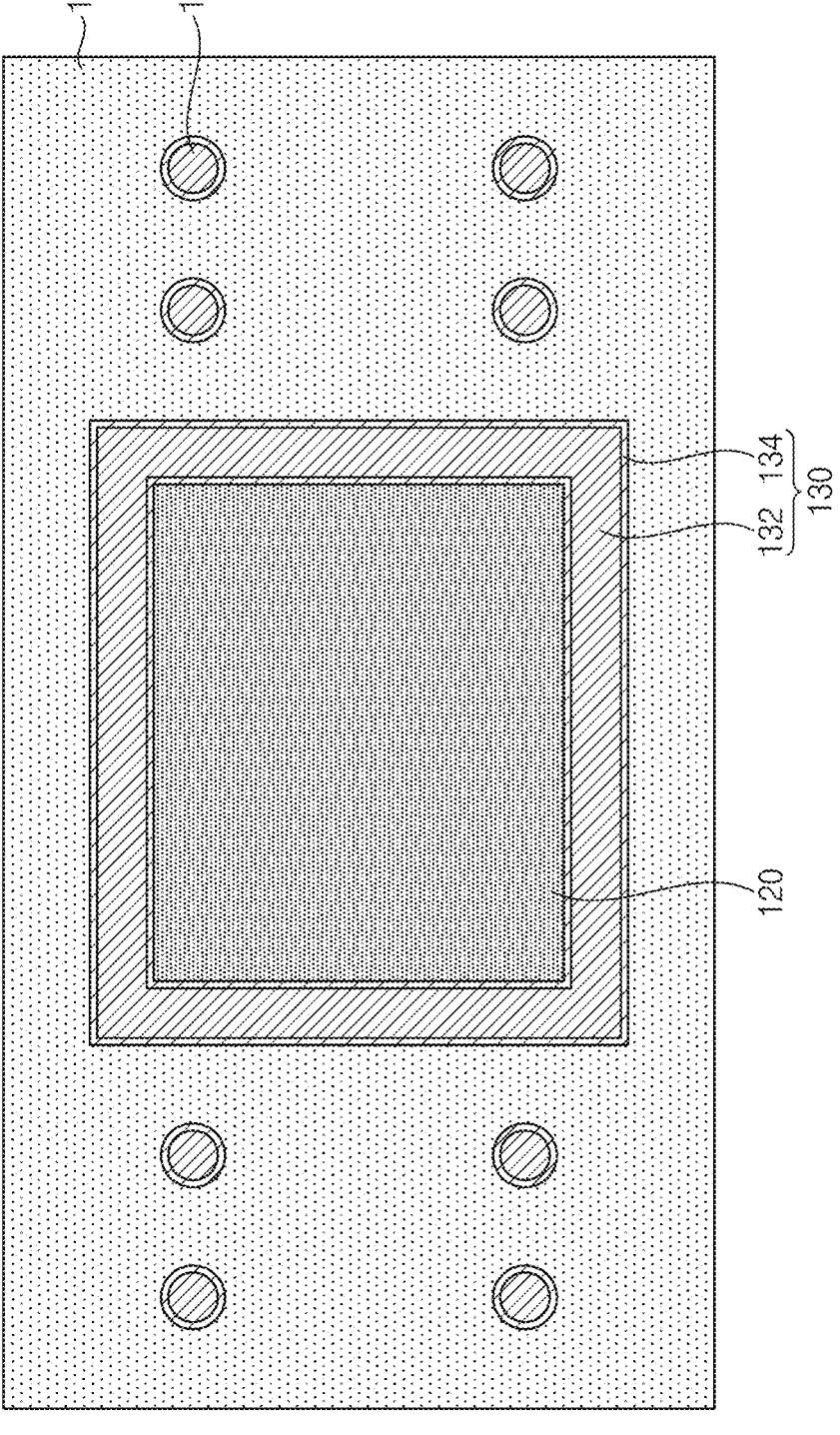
Figure 3:
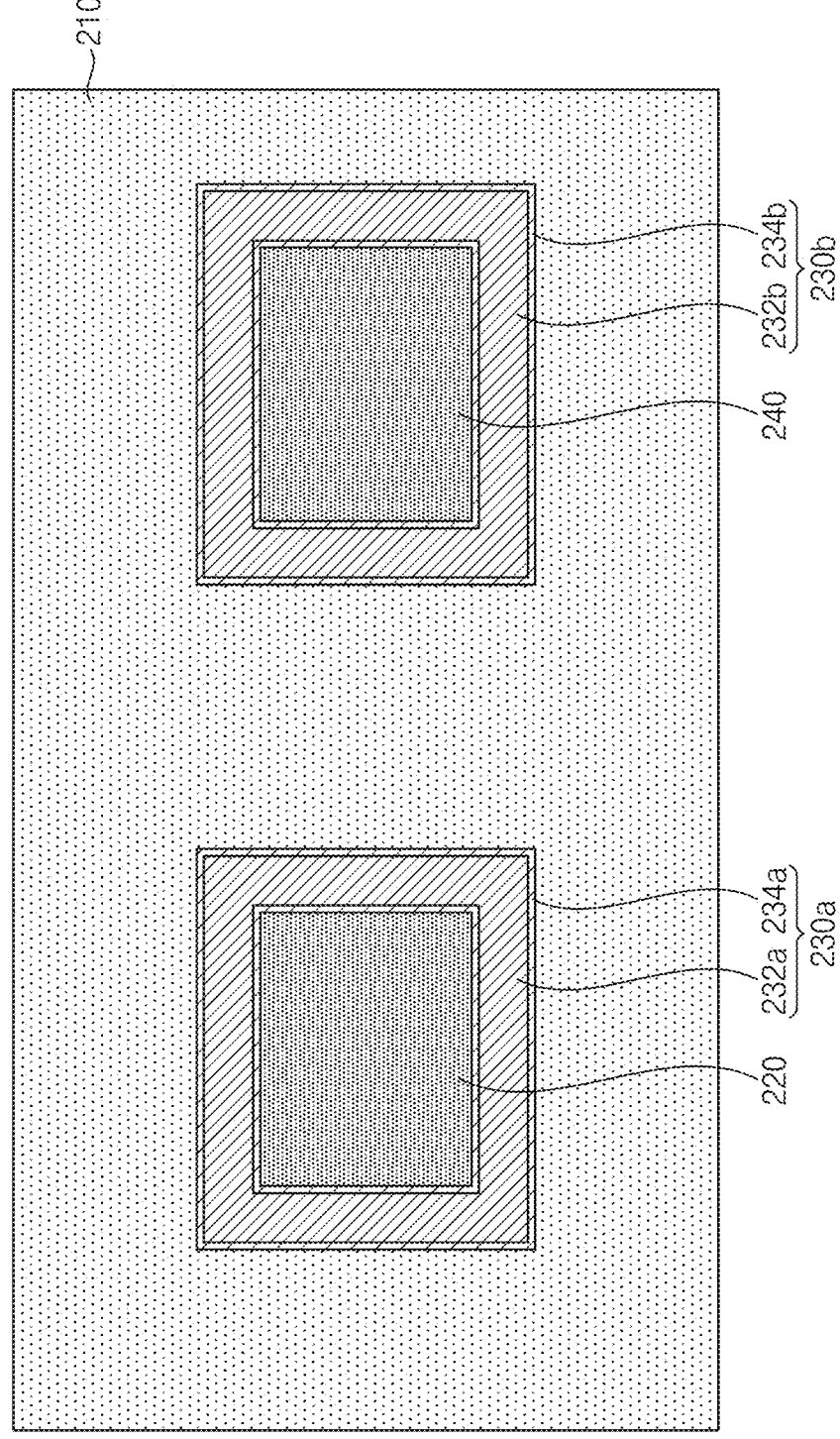
Figure 4:
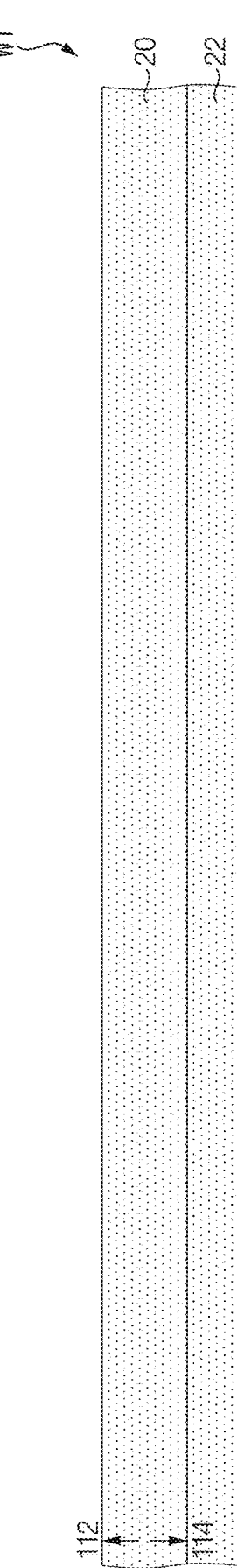

FIG. 1 is a cross-sectional view illustrating a semiconductor package in accordance with example embodiments. FIG. 2 is a plan view illustrating a first semiconductor substrate in FIG. 1. FIG. 3 is a plan view illustrating a second semiconductor substrate in FIG. 1.

Referring to FIGS. 1 to 3, a semiconductor package 10 may include a first semiconductor substrate 110, a first sub package 100 having first and second redistribution wiring layers 150, 160, A second sub package 200 having a second semiconductor substrate 210 and a third redistribution wiring layer 250, a lower redistribution wiring layer 300 in which the first and second sub packages 100, 200 are disposed.

In example embodiments, the first sub package 100 may include a first surface 102 and a second surface 104 opposite to each other. The first sub package 100 may include a first semiconductor substrate 110, a first redistribution wiring layer 150 provided on the second surface 104, and a second redistribution wiring layer 160 provided on the second surface 104.

In example embodiments, the first semiconductor substrate 110 may include a first upper surface 112 and a first lower surface 114 opposite to each other. The first upper surface 112 of the first semiconductor substrate 110 may face the first surface 102 of the first sub package 100, and the first lower surface 114 may face the second surface 104 of the first sub package 100.

The first semiconductor substrate 110 may include at least one first semiconductor chip 120, a first heat dissipation structure 130 covering an outer surface of the first semiconductor chip 120, and a plurality of through vias 140 that penetrate the first semiconductor substrate 110 in a vertical direction. The first semiconductor substrate 110 may include a first cavity accommodating the first semiconductor chip 120, and a plurality of through openings into which the through vias 140 are respectively inserted therein.

An upper surface of the first semiconductor chip 120 may be exposed from the upper surface of the first semiconductor substrate 110, and a lower surface of the first semiconductor chip 120 may be exposed from the lower surface of the first semiconductor substrate 110. For example, the first semiconductor chip may include a memory device. The memory device may include a volatile memory device such as an SRAM device, and a DRAM device, and the memory device may include a nonvolatile memory device such as a flash memory device, a PRAM device, an MRAM device, and an RRAM device.

The first heat dissipation structure 130 may be provided between the outer surface of the first semiconductor chip 120 and an inner surface of the first cavity of the first semiconductor substrate 110. The first heat dissipation structure 130 may be accommodated in the first cavity of the first semiconductor substrate 110 together with the first semiconductor chip 120. The first heat dissipation structure 130 may include a first heat dissipation member 132, and a first liner film 134 provided on an outer surface of the first heat dissipation member 132.

The first heat dissipation member 132 of the first heat dissipation structure 130 may dissipate heat generated from the first semiconductor chip 120. The first heat dissipation member 132 may support the first semiconductor substrate 110 inside the first semiconductor substrate 110 to reduce or prevent warpage of the first semiconductor substrate 110. The first liner film 134 may include silicon oxide or carbon doped silicon oxide. The first liner film 134 may electrically insulate the first semiconductor chip 120 from the through via 140.

For example, the first heat dissipation member 132 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

The plurality of through vias 140 may penetrate through the first semiconductor substrate 110 in the vertical direction. The through vias 140 may be provided in the through opening of the first semiconductor substrate 110, respectively. The through vias 140 may be provided in a peripheral region of the first semiconductor chip 120 in the first semiconductor substrate 110. The through vias 140 may electrically connect the first redistribution wiring layer 150 provided on the first lower surface 114 of the first semiconductor substrate 110 to a second redistribution wiring layer 160 provided on the first upper surface of the first semiconductor substrate 110. For example, the through via 140 may include aluminum (Al), copper (Cu), tin (Sn), nickel (Ni), gold (Au), platinum (Pt), or an alloy thereof.

In example embodiments, the first redistribution wiring layer 150 may be provided on the second surface 104 of the first sub package 100. The first redistribution wiring layer 150 may include a plurality of first redistribution wire 154 and first insulating layers. The first redistribution wiring layer 150 may include a plurality of first bonding pads 152 that is provided to be exposed on the lower surface, that is, the second surface 104 of the first sub package 100.

The first redistribution wire 154 may be provided in the first insulating layers. One end of the first redistribution wire 154 may contact a first chip pad 122 of the first semiconductor chip 120 or the through via 140. The other end of the first redistribution wire 154 may contact the first bonding pad 152. The first redistribution wires 154 may electrically connect the first bonding pads 152 to the through vias 140 of the first semiconductor substrate 110 and the first semiconductor chip 120. For example, the first redistribution wire 154 may include aluminum (Al), copper (Cu), tin (Sn), nickel (Ni), gold (Au), platinum (Pt), or an alloy thereof. The first redistribution wire 154 may be formed by a plating process, an electroless plating process, a vapor deposition process, or the like.

The first insulating layer may include first openings that expose each of the first bonding pads 152 to the second surface 104 of the first sub package 100. For example, the first insulating layer may include a polymer or a dielectric layer. The first insulating layer may be formed by a vapor deposition process, a spin coating process, or the like.

The first bonding pads 152 may be provided in the first insulating layer. The first bonding pad 152 may contact the first lower redistribution pad 310 of the first lower redistribution wiring layer 300 through the first opening. Accordingly, the plurality of first bonding pads 152 may be exposed from the lower surface of the first redistribution wiring layer 150, that is, the second surface 104 of the first sub package 100.

In example embodiments, the second redistribution wiring layer 160 may be provided on the first upper surface 112 of the first sub package 100. The second redistribution wiring layer 160 may include a plurality of second redistribution wires 164 and second insulating layers. The second redistribution wiring layer 160 may include a plurality of second bonding pads 162 that is provided to be exposed on the upper surface, that is, the first surface 102 of the second sub package 200.

The second redistribution wire 164 may be provided in the second insulating layers. One end of the second redistribution wire 164 may contact a second chip pad 222 of the second semiconductor chip 220. The other end of the second redistribution wire 164 may contact the second bonding pad 162. The second redistribution wires 164 may electrically connect the second bonding pads 162 to the through vias 140 of the first semiconductor substrate 110 and the first semiconductor chip 120. For example, the second redistribution wire 164 may include aluminum (Al), copper (Cu), tin (Sn), nickel (Ni), gold (Au), platinum (Pt), or an alloy thereof. The second redistribution wire 164 may be formed by a plating process, an electroless plating process, a vapor deposition process, or the like.

The second insulating layer may include second openings that expose each of the second bonding pads 162 to the first surface 102 of the first sub package 100. For example, the second insulating layer may include a polymer or a dielectric layer. The second insulating layer may be formed by a vapor deposition process, a spin coating process, or the like.

The second bonding pads 162 may be provided in the second insulating layer. The second bonding pad 162 may contact the second sub package 200 through the second opening. Accordingly, the plurality of second bonding pads 162 may be exposed from the upper surface of the second redistribution wiring layer 160, that is, the first surface 102 of the first sub package 100.

In example embodiments, the second sub package 200 may include a third surface 202 and a fourth surface 204 opposite to each other. The second sub package 200 may be disposed on the first sub package 100 such that the fourth surface 204 faces the first surface 102 of the first sub package 100. The second sub package 200 may include a second semiconductor substrate 210, a third redistribution wiring layer 250 provided on the fourth surface 204, and a protective layer 260 provided on the third surface 202.

In example embodiments, the second semiconductor substrate 210 may include a second upper surface 212 and a second lower surface 214 opposite to each other. The second upper surface 212 of the second semiconductor substrate 210 may face the third surface 202 of the second sub package 200, and the second lower surface 214 may face the fourth surface 204 of the second sub package 200.

The second semiconductor substrate 210 may include at least one second semiconductor chip 220, and a second heat dissipation structure 230 covering an outer surface of the second semiconductor chip 220. The second semiconductor substrate 210 may include a second cavity that accommodates the second semiconductor chip 220. The second semiconductor substrate 210 may further include at least one third semiconductor chip 240. The second heat dissipation structure 230 may cover an outer surface of the third semiconductor chip 240. The second semiconductor substrate 210 may further include a third cavity that accommodates the third semiconductor chip 240.

The upper surface of the second semiconductor chip 220 may be exposed to the upper surface of the second semiconductor substrate 210, and a lower surface of the second semiconductor chip 220 may be exposed to the lower surface of the second semiconductor substrate 210. An upper surface of the third semiconductor chip 240 may be exposed to the upper surface of the second semiconductor substrate 210, a lower surface of the third semiconductor chip 240 may be exposed to the lower surface of the second semiconductor substrate 210.

For example, the second and third semiconductor chips 240 may include semiconductor devices such as logic element. The logic element may include a central processing unit (CPU), a graphics processing unit (GPU), a micro processing unit (MPU), a micro control unit (MCU), and an application processor (AP), and the like.

The second heat dissipation structure 230 may be provided between the outer surface of the second semiconductor chip 220 and an inner surface of the second cavity of the second semiconductor substrate 210. The second heat dissipation structure 230 may be accommodated in the second cavity of the second semiconductor substrate 210 together with the second semiconductor chip 220. The second heat dissipation structure 230 may be provided to cover the third semiconductor chip 240 in the third cavity. The second heat dissipation structure 230 may include a second heat dissipation member 232 and a second liner film 234 that is provided on an outer surface of the second heat dissipation member 232.

The second heat dissipation member 232 of the second heat dissipation structure 230 may dissipate heat generated from the second semiconductor chip 220. The second heat dissipation member 232 may support the second semiconductor substrate 210 inside the second semiconductor substrate 210 to reduce or prevent warpage of the second semiconductor substrate 210. The second liner film 234 may include silicon oxide or carbon doped silicon oxide. The second liner film 234 may electrically insulate the outer surface of the second semiconductor chip 220.

For example, the second heat dissipation member 232 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

In example embodiments, the third redistribution wiring layer 250 may be provided on the fourth surface 204 of the second sub package 200. The third redistribution wiring layer 250 may include a plurality of third redistribution wires 254 and third insulating layers. The third redistribution wiring layer 250 may include a plurality of third bonding pads 252 that is provided to be exposed on the lower surface, that is, the fourth surface 204 of the second sub package 200.

The third redistribution wire 254 may be provided in the third insulating layers. One end of the third redistribution wire 254 may contact the second chip pad 222 of the second semiconductor chip 220 or a third chip pad 242 of the third semiconductor chip 240. The other end of the third redistribution wire 254 may contact the third bonding pad 252. The third redistribution wires 254 may electrically connect the third bonding pads 252 to the second semiconductor chip 220 or the third semiconductor chip 240. For example, the third redistribution wire 254 may include aluminum (Al), copper (Cu), tin (Sn), nickel (Ni), gold (Au), platinum (Pt), or an alloy thereof. The third redistribution wire 254 may be formed by a plating process, an electroless plating process, a vapor deposition process, or the like.

The third insulating layer may include third openings that expose each of the third bonding pads 252 to the third surface 202 of the second sub package 200. For example, the third insulating layer may include a polymer or a dielectric layer. The third insulating layer may be formed by a vapor deposition process, a spin coating process, or the like.

The third bonding pads 252 may be provided in the third insulating layer. The third bonding pad 252 may contact second bonding pads 162 of the second redistribution wiring layer 160 of the first sub package 100 through the third opening. Accordingly, the plurality of third bonding pads 252 may be exposed from the lower surface of the third redistribution wiring layer 250, that is, the fourth surface 204 of the second sub package 200. The first and second sub packages 100, 200 may be electrically connected to each other via the second bonding pad 162 of the second redistribution wiring layer 160 and the third bonding pad 252 of the third redistribution wiring layer 250.

The protective layer 260 may be provided on the third surface 202 of the second sub package 200, and the protective layer 260 may include an insulating material to protect the silicon substrate from the outside. The protective layer 260 may be provided on the second upper surface 212 of the second semiconductor substrate 210. The protective layer 260 may include an oxide film or a nitride film, or may include a double layer of an oxide film and a nitride film. The protective layer 260 may include an oxide layer through a high-density plasma chemical vapor deposition (HDP-CVD) process. For example, the oxide layer may include a silicon oxide layer (SiO2).

In example embodiments, the lower redistribution wiring layer first lower redistribution wiring layer may be provided on the second surface 104 of the first sub package 100. The lower redistribution wiring layer 300 may include a third upper surface 302 and a third lower surface 304 opposite to each other.

The lower redistribution wiring layer 300 may include a plurality of lower redistribution wires and lower insulating layers. The lower redistribution wiring layer 300 may include a plurality of first lower redistribution pads 310 provided to be exposed on the upper surface of the lower redistribution wiring layer 300, that is, the third upper surface 302. The lower redistribution wiring layer 300 may include a plurality of second lower redistribution pads 320 provided to be exposed on the lower surface of the lower redistribution wiring layer 300, that is, the third lower surface 304. The lower redistribution wire may be provided in the lower insulating layers. The lower redistribution wires 340 may electrically connect the first and second lower redistribution pads 310, 320 to each other.

The first lower redistribution pads 310 may be provided in the lower insulating layer. The first lower redistribution pad 310 may contact the first bonding pads 152 of the first redistribution wiring layer 150 of the first sub package 100. The lower redistribution wiring layer 300 and the first sub package 100 may be electrically connected via the first lower redistribution pad 310 of the lower redistribution wiring layer 300 and the first bonding pads 152 of the first sub package 100.

The second lower redistribution pads 320 may be provided in the lower insulating layer. The plurality of second lower redistribution pads 320 may be exposed from the lower surface of the lower redistribution wiring layer 300, that is, the third lower surface 304. External connection bumps 330 may be provided on the second lower redistribution pads 320, respectively.

The lower redistribution wiring layer 300 may be connected to other semiconductor devices through the external connection bumps 330 as conductive connection members. The external connection bumps 330 may be provided on the second lower redistribution pads 320, respectively. For example, the external connection bump 330 may include a C4 bump. The second lower redistribution pads 320 of the lower redistribution wiring layer 300 may be electrically connected to substrate pads of a package substrate through the external connection bumps 330.

As described above, the first sub package 100 having the first semiconductor chip 120 may be bonded to the third bonding pads 252 that are exposed from the fourth surface 204 of the second sub package 200 having the second semiconductor chip 220 via the second bonding pads 162 exposed from the first surface 102. The first and second semiconductor chips 120, 220 may be electrically connected to each other through second and third redistribution wiring layers 160, 250 that are bonded to each other through second and third bonding pads 162, 252. Since the first and second semiconductor chips 120, 220 are stacked in a vertical direction through the second and third redistribution wiring layers 160, 250, space utilization may be increased. Since the first and second semiconductor chips 120, 220 are accommodated in the first and second cavities of the first and second semiconductor substrates 110, 210, respectively, the first and second semiconductor chips 120, 220 may be accommodated in various positions in accordance with a required package structure.

Also, the first and second heat dissipation structures 130, 230 covering the outer surfaces of the first and second semiconductor chips 120, 220, respectively may include conductive materials such as the through vias 140. The first and second heat dissipation structures 130, 230 may dissipate heat from the first and second semiconductor chips 120, 220. The first and second heat dissipation structures 130, 230 may be provided inside the first and second semiconductor substrates 110, 210, respectively to reduce or prevent warpage that occurs in the first and second semiconductor substrates 110, 210.

Hereinafter, a method of manufacturing the semiconductor package in FIG. 1 will be described.

FIGS. 4 to 26 are views illustrating a method of manufacturing a semiconductor package in accordance with example embodiments.

First, a method of manufacturing a first sub package 100 will be described.

Figure 5:
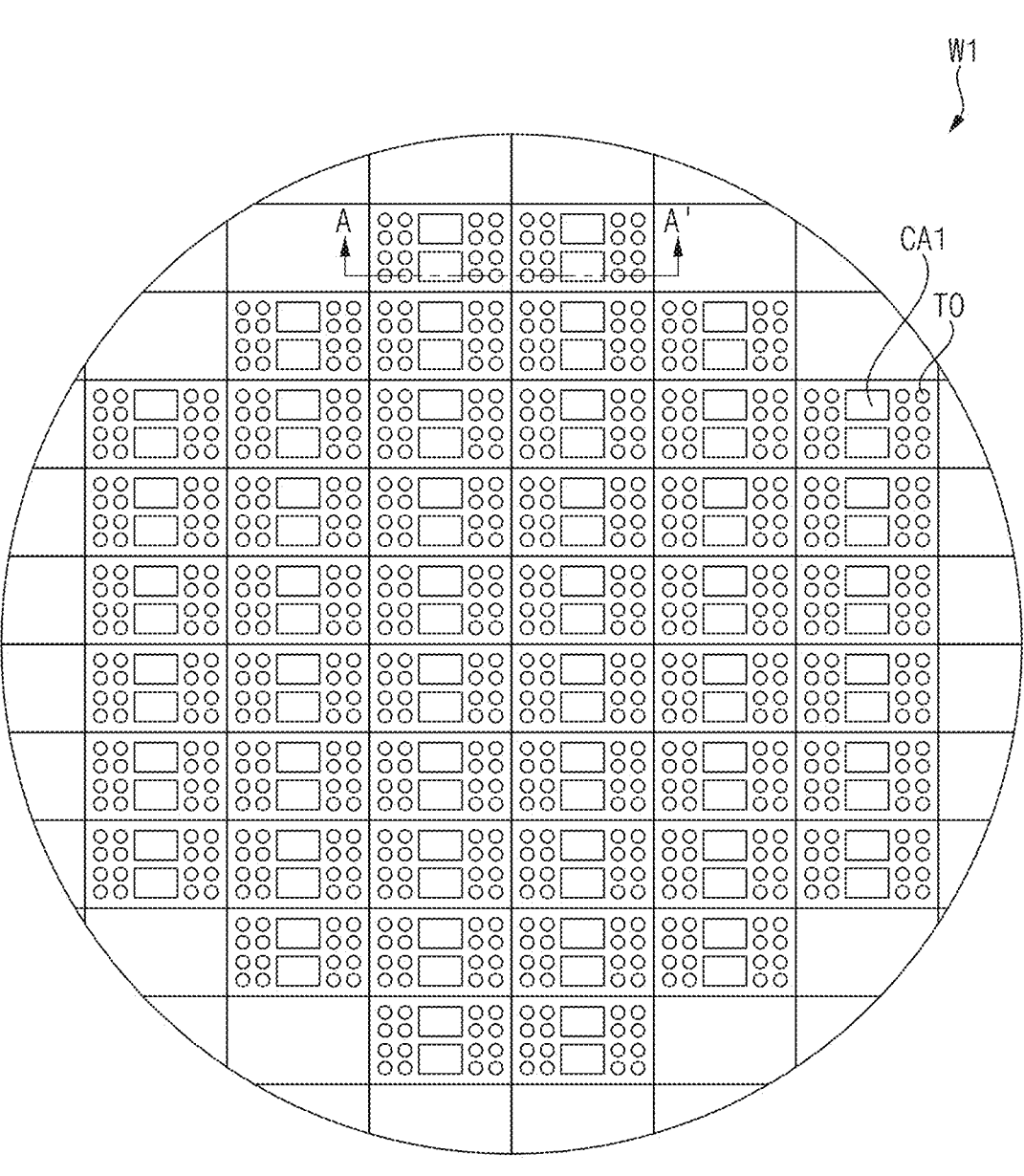
Figure 6:
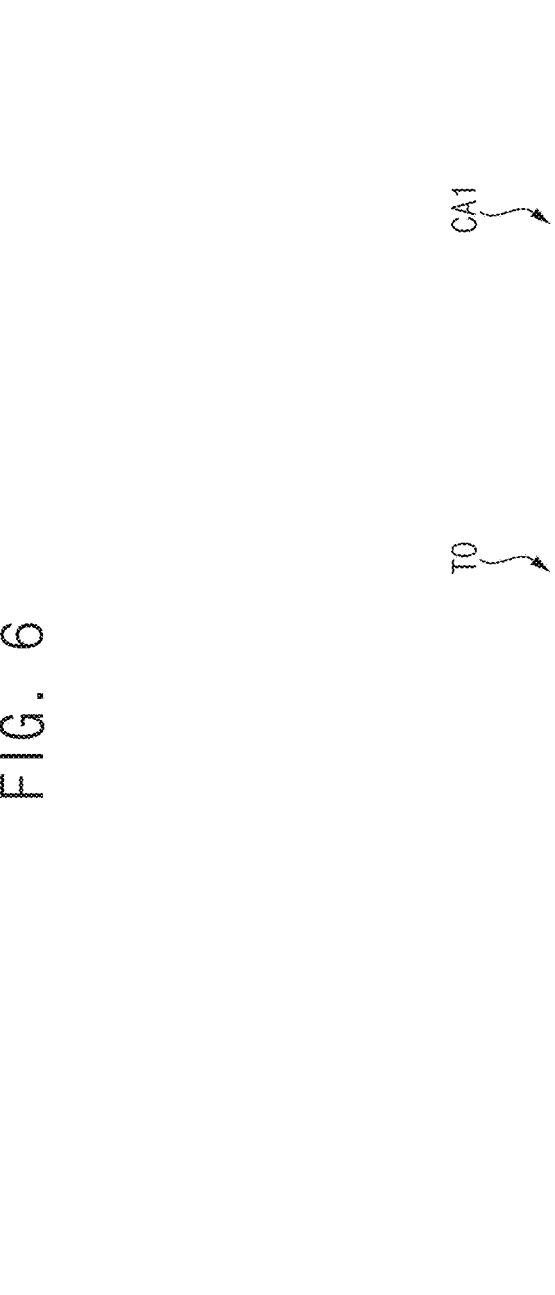
Figure 7:
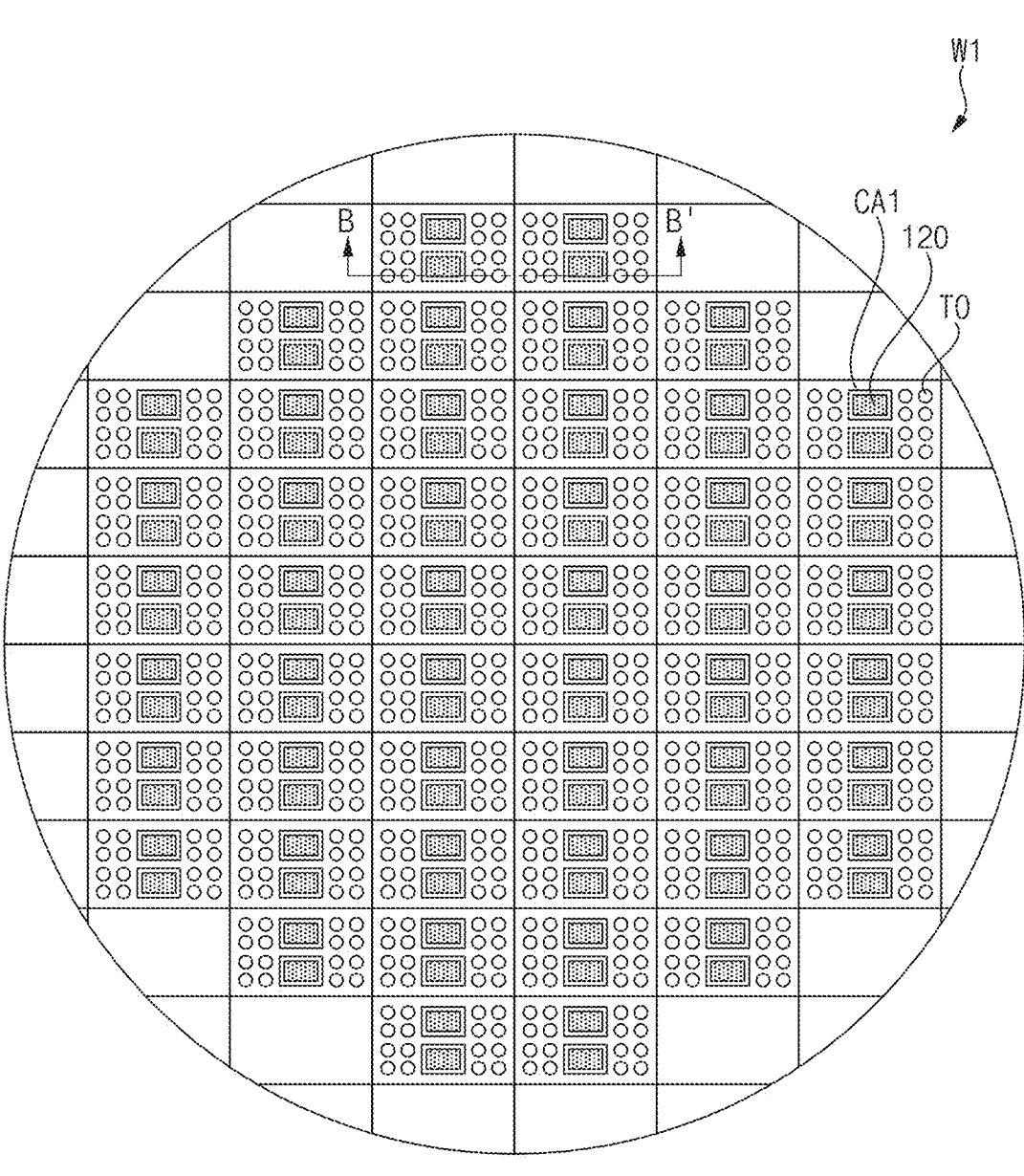
Figure 8:
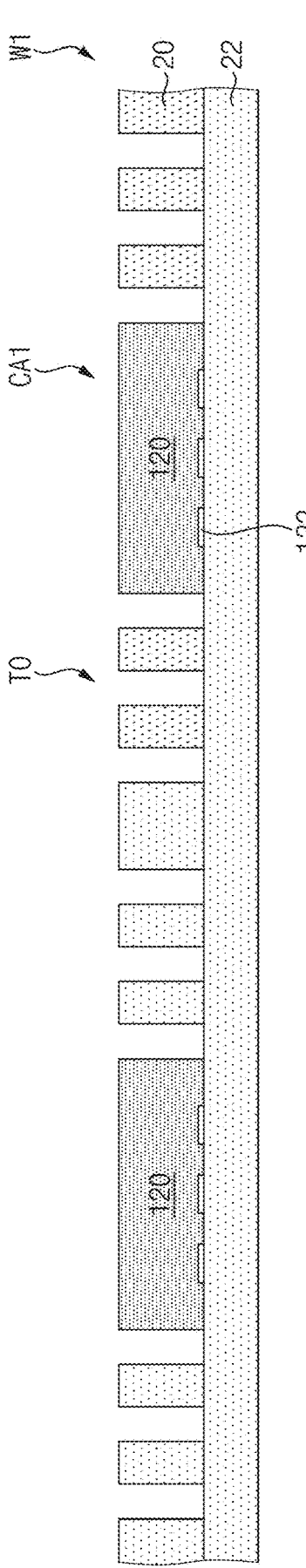

FIG. 5 is a plan view illustrating a first semiconductor wafer including bonded silicon wafers. FIG. 6 is a cross-sectional view taken along the line A-A' in FIG. 5. FIG. 7 is a plan view illustrating a first semiconductor wafer on which first semiconductor chips are mounted. FIG. 8 is a cross-sectional view taken along the line B-B' in FIG. 7.

Referring to FIGS. 4 to 8, a plurality of first cavities CA1 and a plurality of through openings TO are formed on a first upper silicon substrate 20, and first semiconductor chips 120 may be arranged in the first cavities CA1.

In example embodiments, the first upper silicon substrate 20 and a first lower silicon substrate 22 may be bonded to each other to form a first semiconductor wafer W1. The first upper silicon substrate 20 and the first lower silicon substrate 22 may be bonded to each other by wafer-wafer direct bonding.

The first upper silicon substrate 20 may have a first upper surface 112 and a first lower surface 114 opposite to each other. The first lower silicon substrate 22 may be bonded to the first lower surface 114 of the first upper silicon substrate 20.

For example, the first upper silicon substrate 20 and the first lower silicon substrate 22 may include a semiconductor material such as silicon, germanium, silicon-germanium. The first upper silicon substrate 20 and the first lower silicon substrate 22 may include a III-V group compound semiconductor such as gallium phosphide (GaP), gallium arsenide (GaAs), gallium antimony GaSb. In example embodiments, the first upper silicon substrate 20 and the first lower silicon substrate 22 may include a silicon-on-insulator (SOI) substrate or a germanium-on-insulator (GOI) substrate.

Then, a first photoresist layer may be formed on the first upper silicon substrate 20, and an exposure process may be performed on the first photoresist layer to form a first photoresist pattern that exposes regions of the first cavities CA1 and through openings TO.

As illustrated in FIGS. 5 and 6, the first upper silicon substrate 20 may be selectively removed to form the first cavities CA1 and the through openings TO. An etching process may be performed on the first photoresist pattern on the first upper silicon substrate 20 to form the first cavities CA1 and the through openings TO. For example, the etching process may include a wet etching process, a dry etching process, a plasma etching process, and the like.

The wet etching process may be performed using an etchant that has an etching selectivity with respect to the silicon substrate. For example, the etchant may include water (H2O), hydrogen peroxide (H2O2), citric acid (C6H8O7), and the like. The dry etching process may include a physical etching process, a chemical etching process, and a physical chemical etching process. The plasma etching process may be performed using inductively coupled plasma, capacitively coupled plasma, microwave plasma, or the like.

As illustrated in FIGS. 7 and 8, the first semiconductor chips 120 may be accommodated in the first cavities CA1, respectively. The first semiconductor chip 120 may be arranged on the first lower silicon substrate 22. An outer surface of the first semiconductor chip 120 may be spaced apart from an inner surface of the first cavities CA1. First chip pads 122 of the first semiconductor chip 120 may face the first lower silicon substrate 22.

Figure 9:
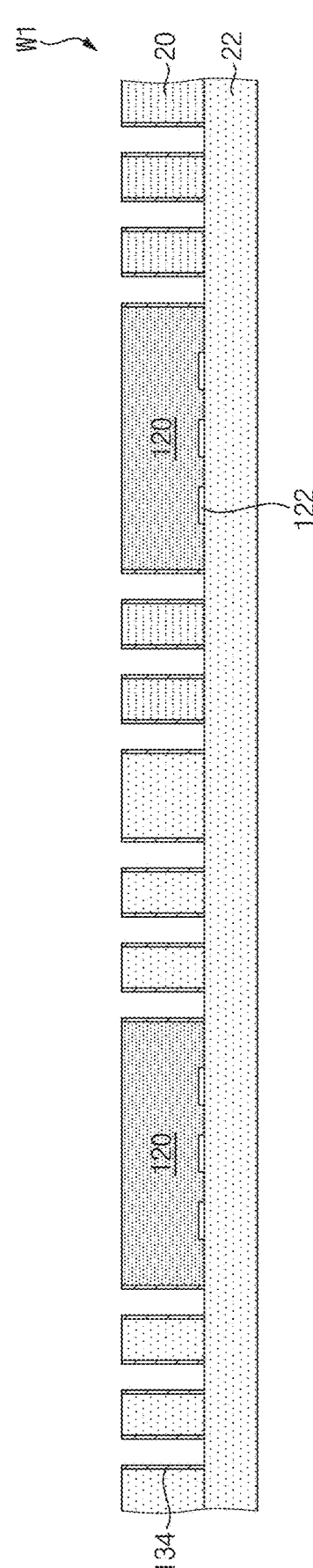
Figure 10:
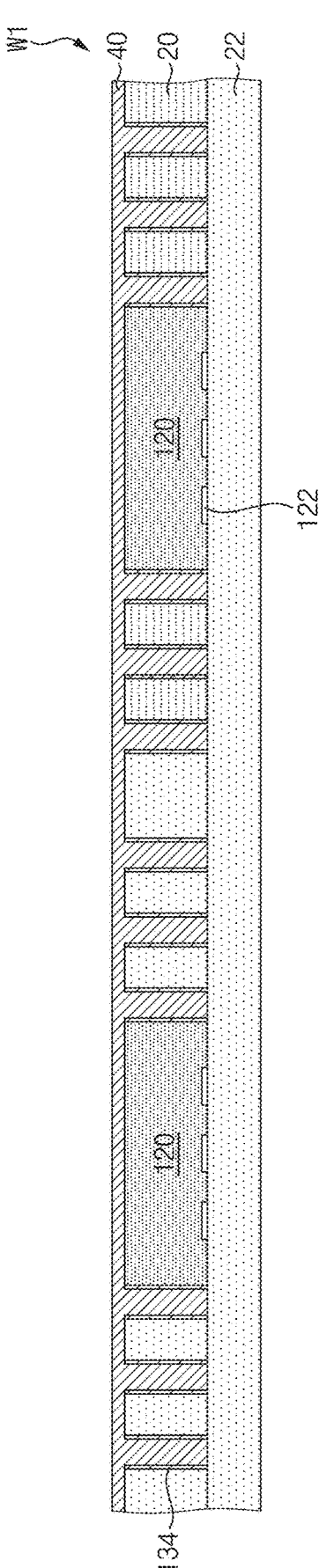
Figure 11:
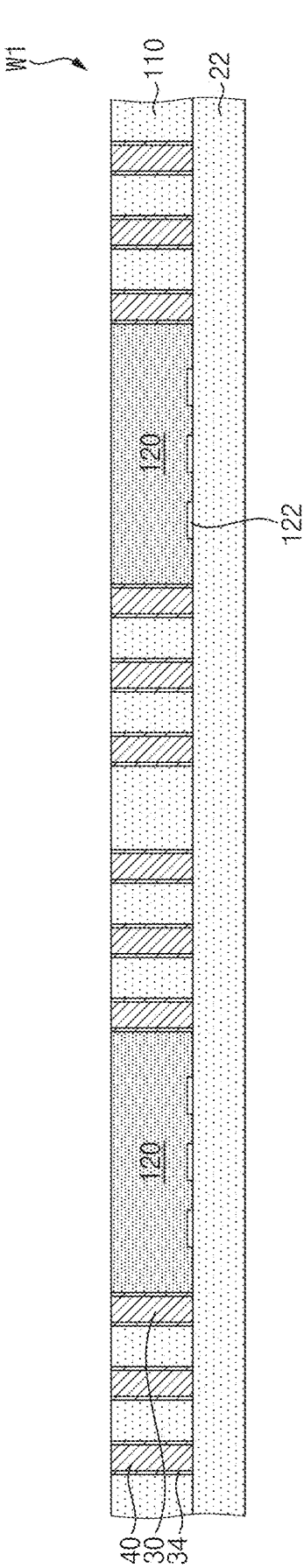

Referring to FIGS. 9 to 11, a first heat dissipation structure 130 may be formed in the first cavity CA1 of the first upper silicon substrate 20, and a through via 140 may be formed in the through opening TO.

As illustrated in FIG. 9, a first liner film 134 may be formed on an inner surface of the first upper silicon substrate 20. The first liner film 134 may be formed on the inner surface of the first cavity CA1 and an inner surface of the through opening TO.

For example, the liner film may include a polymer or a dielectric layer. For example, the liner film may include polyimide (PI), lead oxide (PbO), polyhydroxystyrene (PHS), NOVOLAC, and the like. The liner film may be formed by a vapor deposition process, a spin coating process, or the like.

As illustrated in FIG. 10, a seed layer may be formed on the first upper silicon substrate 20, and a first plating process may be performed on the seed layer to form a first plating layer 40. The first cavity CA1 and the through openings TO may be filled up with a first metal material to form the first plating layer 40. For example, the first metal material may include copper (Cu), aluminum (Al), tungsten (W), nickel (Ni), molybdenum (Mo), gold (Au), silver (Ag), chromium (Cr), Tin (Sn) and titanium (Ti).

As illustrated in FIG. 11, the first plating layer 40 on the first upper silicon substrate 20 may be polished to form the first heat dissipation structure 130 and the through via 140.

The first plating layer 40 on the first upper silicon substrate 20 may be polished by a wafer support system (WSS). An upper surface of the first upper silicon substrate 20 may be removed until portions of the first heat dissipation structure 130 and the through vias 140 are exposed. The upper surface of the first upper silicon substrate 20 may be removed until the upper surface of the first semiconductor chip 120 is exposed.

The upper surface of the first upper silicon substrate 20 may be partially removed by a grinding process such as a chemical mechanical polishing (CMP) process. Accordingly, a thickness of the first upper silicon substrate 20 may be reduced to a desired thickness. One end of the first heat dissipation structure 130 may be exposed from the upper surface of the first upper silicon substrate 20. One end of the through via 140 may be exposed from the upper surface of the first upper silicon substrate 20. The upper surface of the first semiconductor chip 120 may be exposed from the upper surface of the first upper silicon substrate 20.

The first heat dissipation structures 130 and the through vias 140 may be formed simultaneously. The first heat dissipation structures 130 may be electrically insulated, and the through vias 140 may electrically connect the first and second redistribution wiring layers 150 and 160. The first heat dissipation structures 130 may dissipate heat from the outer surface of the first semiconductor chip 120 and reduce or prevent warpage of the first upper silicon substrate 20. The first heat dissipation structures 130 may increase durability of the semiconductor package 10 by internally supporting the semiconductor package 10.

Figure 12:
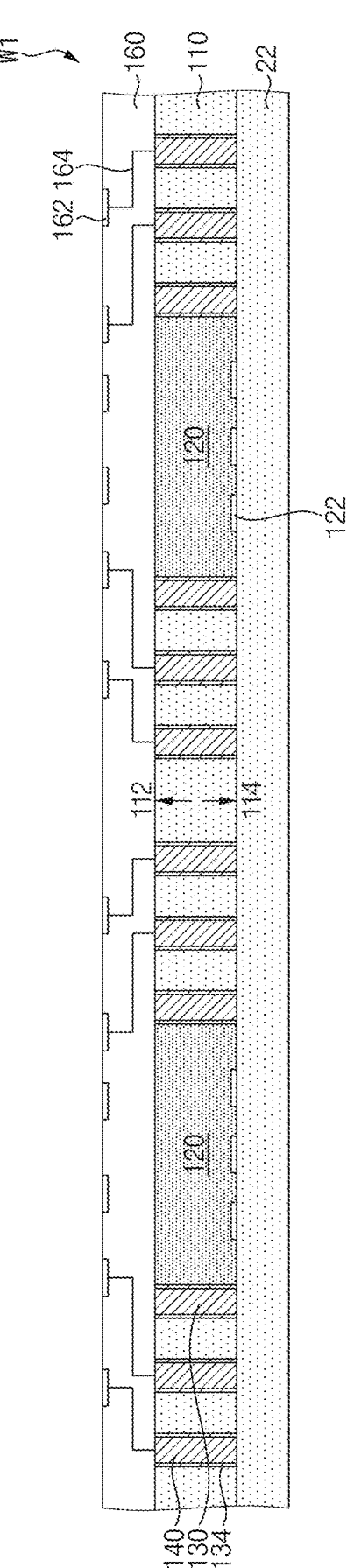
Figure 13:
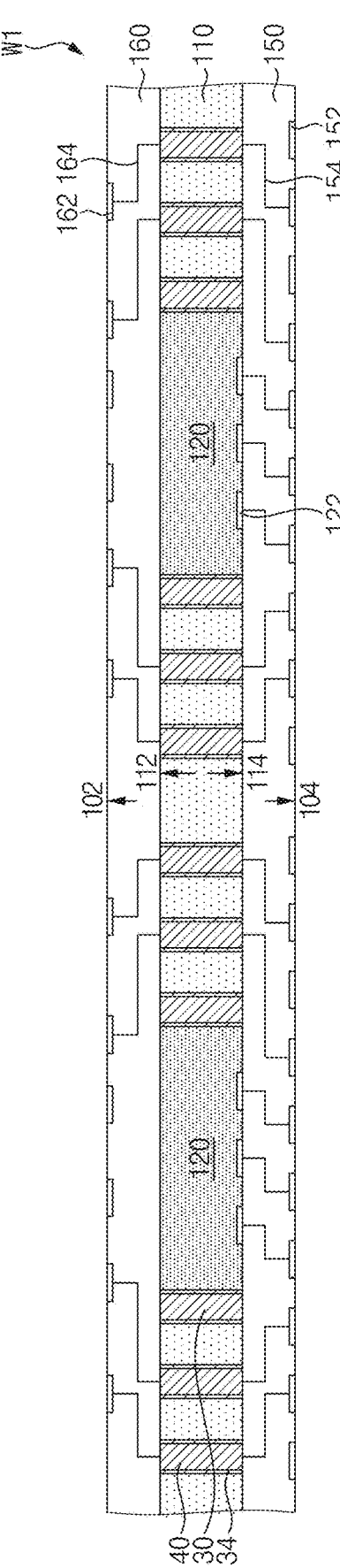
Figure 14:
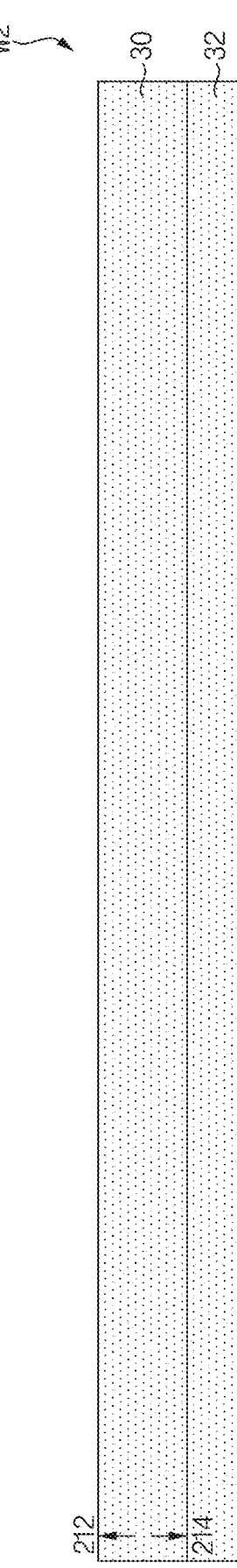

Referring to FIGS. 12 and 13, a first redistribution wiring layer 150 may be formed on the first lower surface 114 of the first upper silicon substrate 20, and the second redistribution wiring layer 160 may be formed on the first upper surface 112 of the first upper silicon substrate 20.

As illustrated in FIG. 12, first, the second redistribution wiring layer 160 may be formed on the first upper surface 112 of the first upper silicon substrate 20. The second redistribution wiring layer 160 may include a second insulating layer and a second redistribution wire 164. The second redistribution wiring layer 160 may be formed to expose second bonding pads 162 from the second insulating layer.

For example, the second redistribution wire 164 may be formed in the second insulating layer. One end of the second redistribution wire 164 may contact the through via 140 and the other end of the second redistribution wire 164 may contact the second bonding pad 162. The second insulating layer may be formed to expose an upper surface of the second bonding pad 162 through the second opening.

After a seed layer is formed on a portion of the second insulating layer, the seed layer may be patterned to form the second redistribution wire 164 through an electroplating process. The second redistribution wire 164 may be formed to contact the second bonding pad 162 through the second opening. For example, the second redistribution wire may include aluminum (Al), copper (Cu), tin (Sn), nickel (Ni), gold (Au), platinum (Pt), or an alloy thereof.

The second bonding pad 162 may be formed on the second insulating layer and may contact the second redistribution wire 164 through the second opening. Accordingly, the second bonding pad 162 may be formed to be exposed from the upper surface of the second insulating layer. For example, the second bonding pad 162 may include a metal material such as copper (Cu) or aluminum (Al).

As illustrated in FIG. 13, the first redistribution wiring layer 150 may be formed on the first lower surface 114 of the first upper silicon substrate 20 after removing the first lower silicon substrate 22. The first redistribution wiring layer 150 may have a first insulating layer and a first redistribution wire 154. The first redistribution wiring layer 150 may be formed to expose the first bonding pads 152 from the first insulating layer.

For example, the first redistribution wire 154 may be formed in the first insulating layer. One end of the first redistribution wire 154 may be formed to contact the through via 140 or the first chip pad 122 of the first semiconductor chip 120. The other end of the first redistribution wire 154 may be formed to contact the first bonding pad 152. The first insulating layer may be formed to expose a lower surface of the first bonding pad 152 through a first opening.

After a seed layer is formed on a portion of the first insulating layer, the seed layer may be patterned to from the first redistribution wire 154 by an electroplating process. The first redistribution wire 154 may be formed to contact the first bonding pad 152 through the first opening. For example, the first redistribution wire may include aluminum (Al), copper (Cu), tin (Sn), nickel (Ni), gold (Au), platinum (Pt), or an alloy thereof.

The first bonding pad 152 may be formed on the first insulating layer and may contact the first redistribution wire 154 through the first opening. Accordingly, the first bonding pad 152 may be formed to be exposed from the lower surface of the first insulating layer. For example, the first bonding pad 152 may include a metal material such as copper (Cu) or aluminum (Al).

After the second redistribution wiring layer 160 is formed on the first upper surface 112 of the first upper silicon substrate 20, the first semiconductor wafer W1 having a plurality of first sub packages 100 may be completed by forming the first redistribution wiring layer 150 on the first lower surface 114 of the first upper silicon substrate 20.

Figure 15:
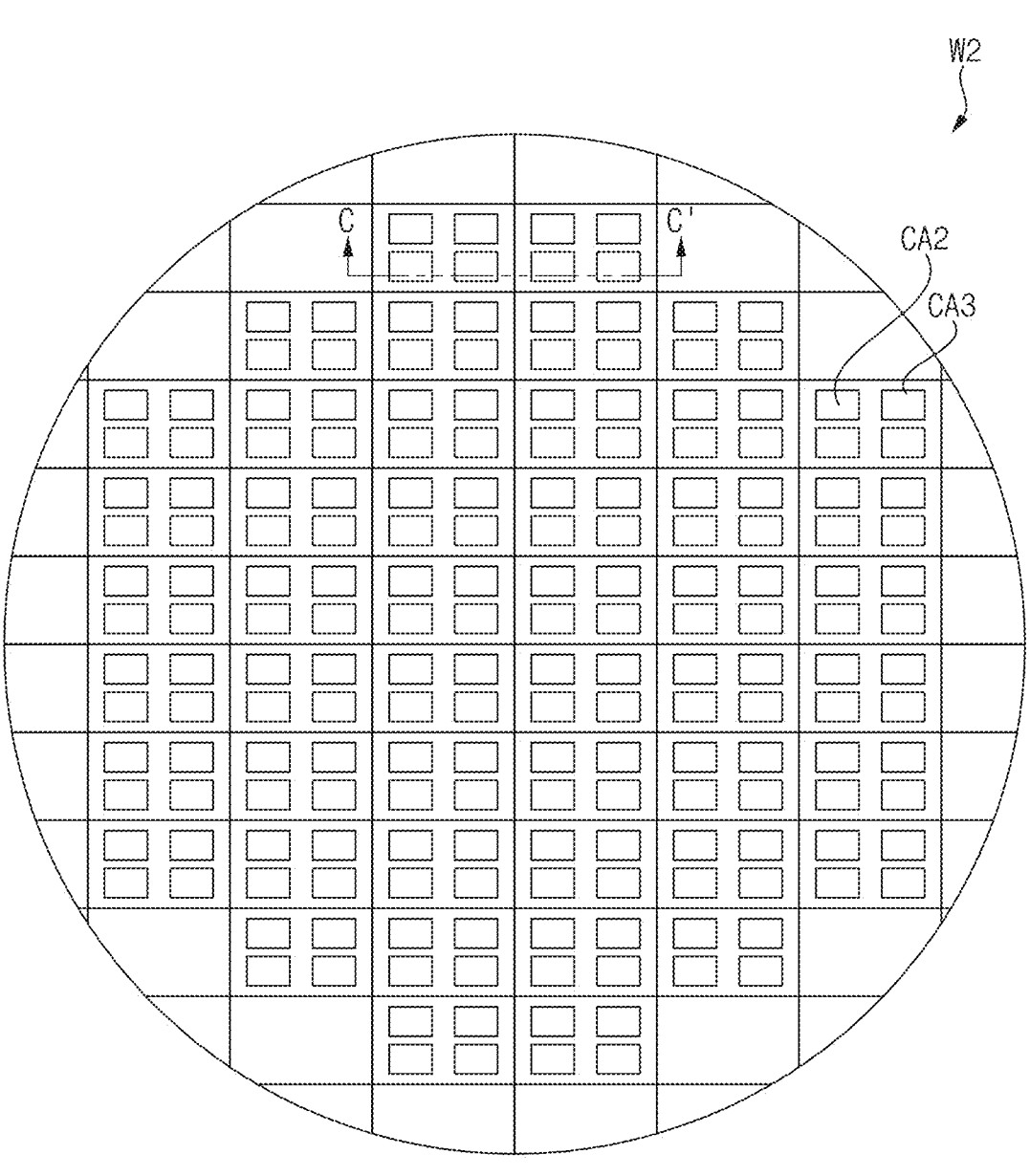
Figure 16:
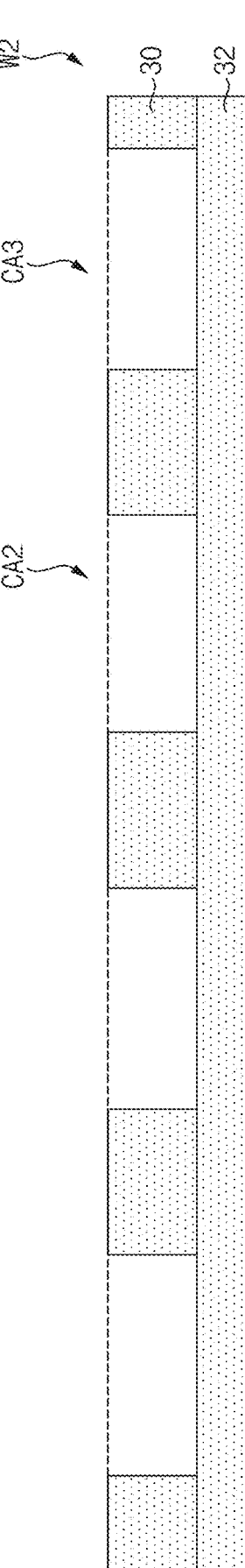

FIG. 15 is a plan view illustrating a second semiconductor wafer formed by bonding silicon wafers together. FIG. 16 is a cross-sectional view taken along the line C-C' in FIG. 15.

Figure 17:
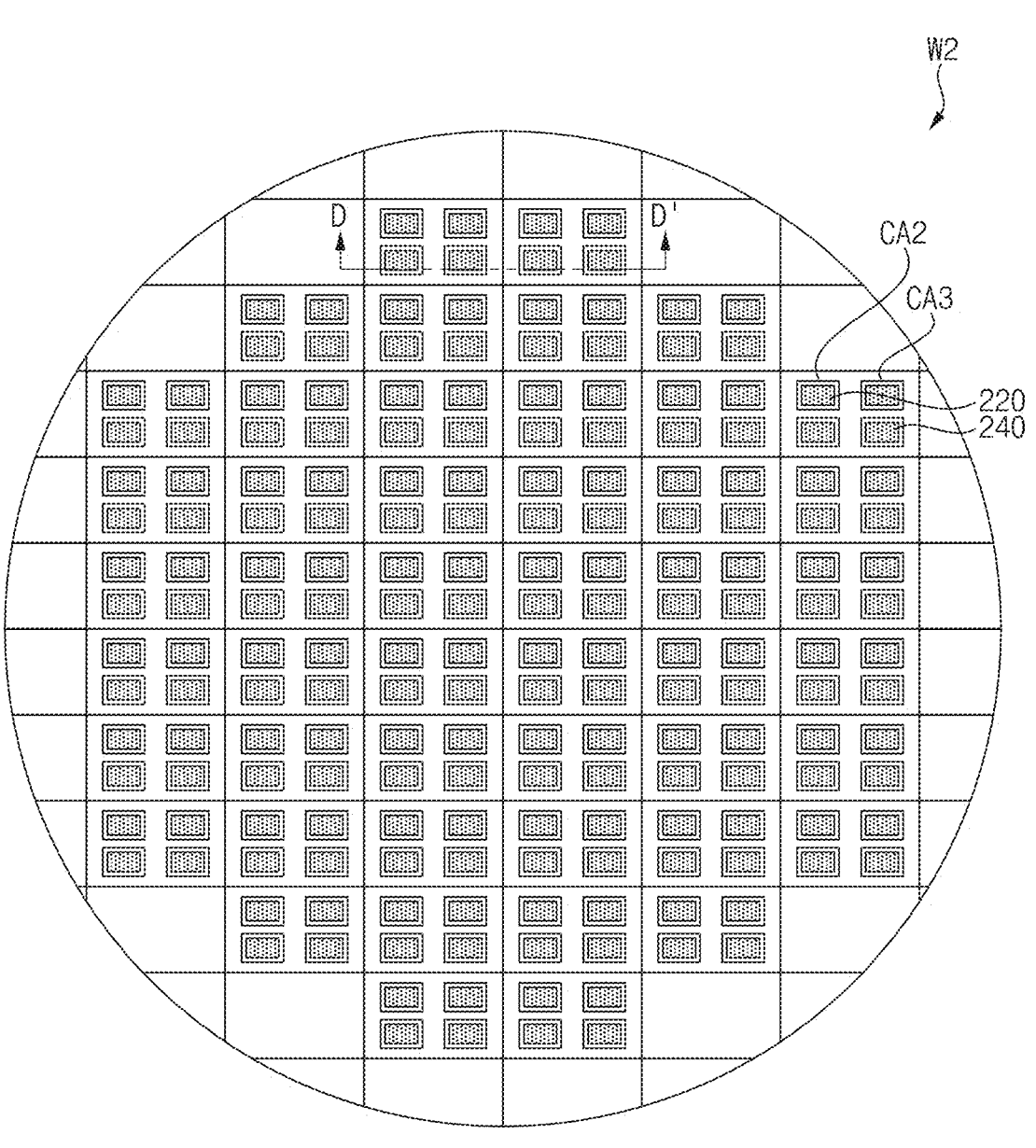
Figure 18:
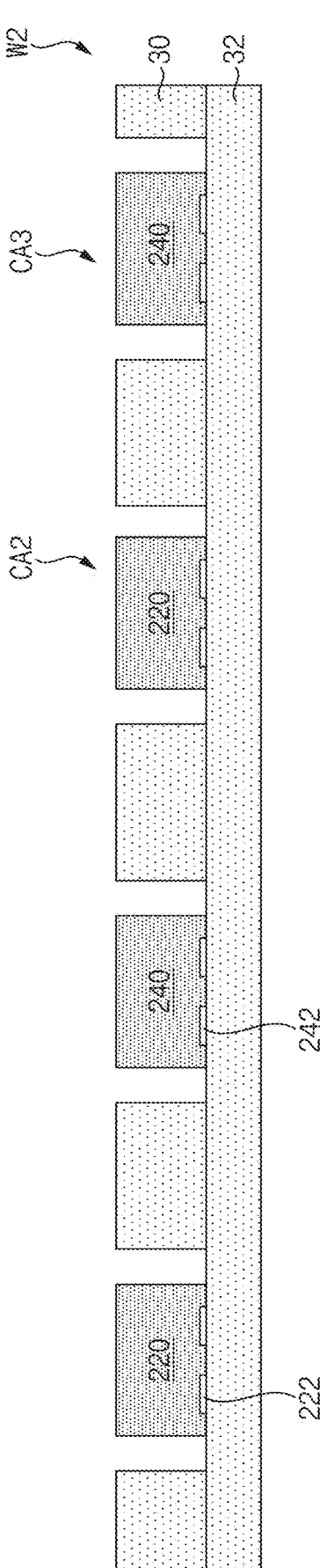

FIG. 17 is a plan view illustrating a second semiconductor wafer on which second and third semiconductor chips are mounted. FIG. 18 is a cross-sectional view taken along the line D-D' in FIG. 17.

Referring to FIGS. 14 to 18, processes the same as or similar to the processes described with reference to FIGS. 4 to 8 may be performed to form a plurality of second cavities CA2 and a plurality of third cavities CA3 on a second upper silicon substrate 30. Second semiconductor chips 220 may be disposed in the second cavities CA2, and third semiconductor chips 240 may be disposed in the third cavities CA3.

In example embodiments, the second upper silicon substrate 30 and a second lower silicon substrate 32 may be bonded to each other to form a second semiconductor wafer W2. The second upper silicon substrate 30 and the second lower silicon substrate 32 may be bonded to each other by wafer-wafer direct bonding.

The second upper silicon substrate 30 may have a second upper surface 212 and a second lower surface 214 opposite to each other. The second lower silicon substrate 32 may be bonded to the second lower surface 214 of the second upper silicon substrate 30.

For example, the second upper silicon substrate 30 and the second lower silicon substrate 32 may include a semiconductor material such as silicon, germanium, silicon-germanium. The second upper silicon substrate 30 and the second lower silicon substrate 32 may include a III-V group compound semiconductor such as gallium phosphide (GaP), gallium arsenide (GaAs), gallium antimony GaSb. In example embodiments, the second upper silicon substrate 30 and the second lower silicon substrate 32 may include a silicon-on-insulator (SOI) substrate or a germanium-on-insulator (GOI) substrate.

Then, a second photoresist layer may be formed on the second upper silicon substrate 30, and an exposure process may be performed on the second photoresist layer to form a second photoresist pattern that exposes regions of the second and third cavities CA2, CA3.

As illustrated in FIGS. 15 and 16, the second and third cavities CA2, CA3 may be formed by selectively removing the second upper silicon substrate 30. An etching process may be performed on the second photoresist pattern on the second upper silicon substrate 30 to form second and third cavities CA2, CA3. For example, the etching process may include a wet etching process, a dry etching process, a plasma etching process, and the like.

As illustrated in FIGS. 17 and 18, the second semiconductor chips 220 may be accommodated in the second cavities CA2, respectively. The third semiconductor chips 240 may be accommodated in the third cavities CA3, respectively. The second and third semiconductor chips 220, 240 may be disposed on the second lower silicon substrate 32. Outer surfaces of each of the second and third semiconductor chips 220, 240 may be spaced apart from inner surfaces of the second and third cavities CA2, CA3. Second chip pads 222 of the second semiconductor chip 220 may face the second lower silicon substrate 32. Third chip pads 242 of the third semiconductor chip 240 may face the second lower silicon substrate 32.

Figure 19:
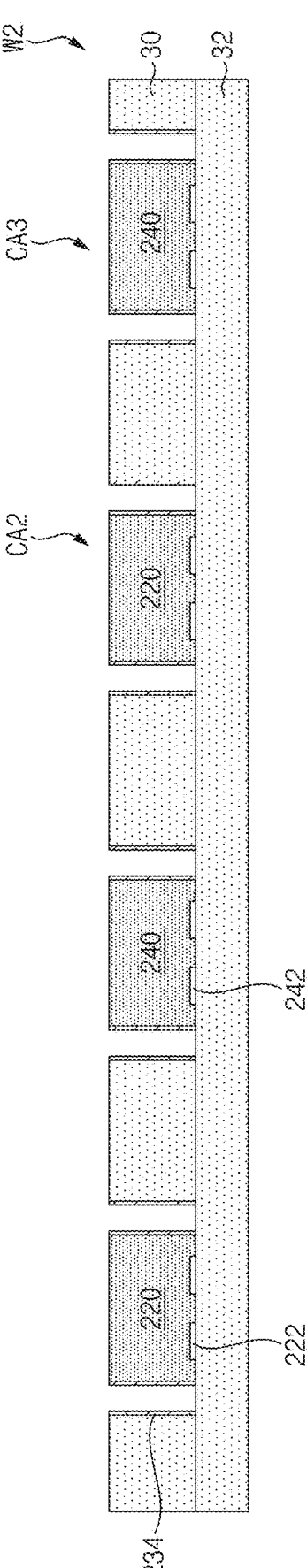
Figure 20:
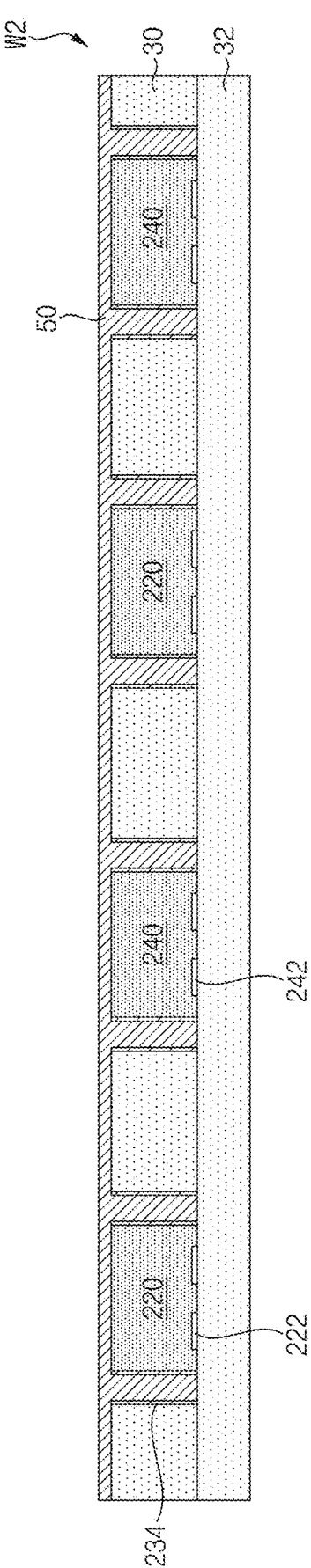
Figure 21:
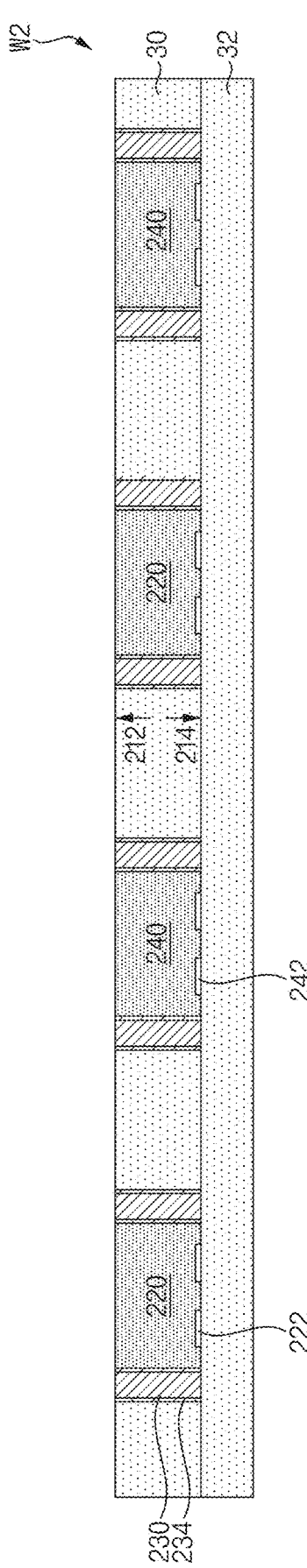

Referring to FIGS. 19 to 21, processes the same as or similar to the processes described with reference to FIGS. 9 to 11 may be performed to form second heat dissipation structure 230 in the second and third cavities CA2, CA3 of the second upper silicon substrate 30, respectively.

As illustrated in FIG. 19, a second liner film 234 may be formed on an inner surface of the second upper silicon substrate 30. The second liner film 234 may be formed on the inner surface of each of the second and third cavities CA2, CA3.

As illustrated in FIG. 20, a seed layer may be formed on the second upper silicon substrate 30, and a second plating process may be performed on the seed layer to form a second plating layer 50. The second plating layer 50 may fill the second and third cavities CA2, CA3 through a second metal material. For example, the second metal material may include copper (Cu), aluminum (Al), tungsten (W), nickel (Ni), molybdenum (Mo), gold (Au), silver (Ag), chromium (Cr), Tin (Sn) and titanium (Ti).

As illustrated in FIG. 21, the second plating layer 50 on the second upper silicon substrate 30 may be polished to form the second heat dissipation structure 230.

The second plating layer 50 on the second upper silicon substrate 30 may be polished by a wafer support system (WSS). An upper surface of the second upper silicon substrate 30 may be removed until a portion of the second heat dissipation structure 230 is exposed. The upper surface of the second upper silicon substrate 30 may be removed until upper surfaces of the second and third semiconductor chips 220, 240 are exposed.

The upper surface of the second upper silicon substrate 30 may be partially removed by a grinding process such as a chemical mechanical polishing (CMP) process. Accordingly, a thickness of the second upper silicon substrate 30 may be reduced to a desired thickness. One end of the second heat dissipation structure 230 may be exposed from the upper surface of the second upper silicon substrate 30. The upper surfaces of the second and third semiconductor chips 220, 240 may be exposed from the upper surface of the second upper silicon substrate 30.

The second heat dissipation structures 230 may be electrically insulated. The second heat dissipation structures 230 may dissipate heat from the outer surface of each of the second and third semiconductor chips 220, 240, and the second heat dissipation structures 230 may reduce or prevent warpage of the second upper silicon substrate 30. The second heat dissipation structures 230 may increase durability of the semiconductor package 10 by internally supporting the semiconductor package 10.

Figure 22:
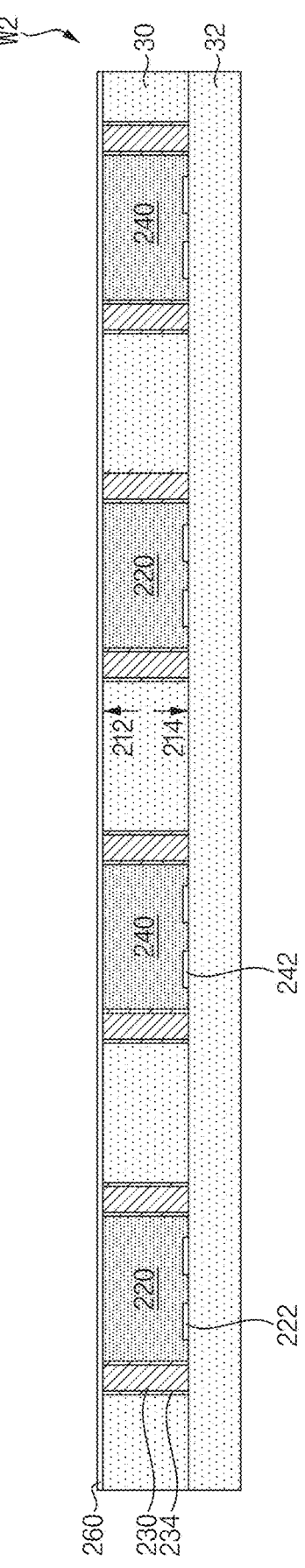
Figure 23:
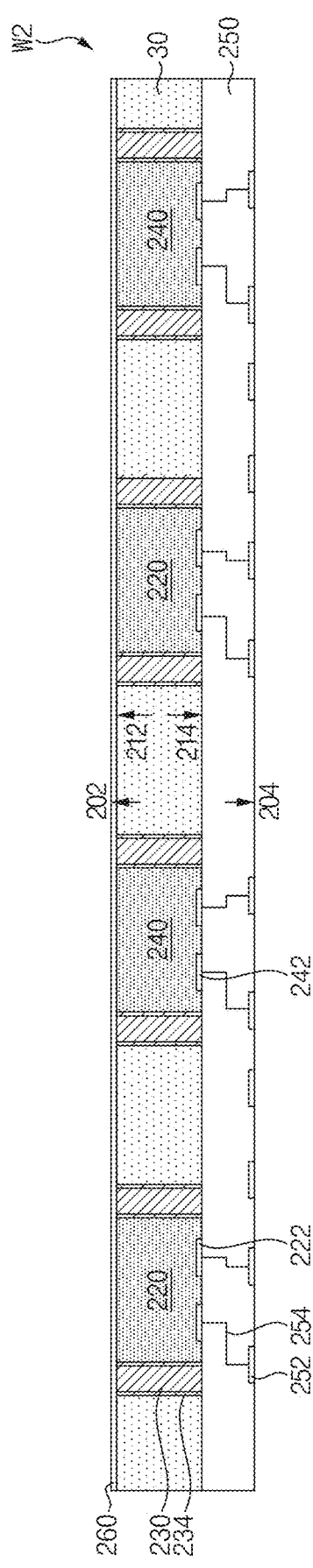

Referring to FIGS. 22 to 23, processes the same as or similar to the processes described with reference to FIGS. 12 and 13 may be by performed to remove the second lower silicon substrate 32 from the second upper silicon substrate 30, a third redistribution wiring layer 250 may be formed on the second lower surface 214 of the second upper silicon substrate 30, and a protective layer 260 may be formed on the second upper surface 212 of the second upper silicon substrate 30.

As illustrated in FIG. 22, first, the protective layer 260 may be formed on the second upper surface 212 of the second upper silicon substrate 30. The protective layer 260 may include an insulating material to protect the second upper silicon substrate from the outside. The protective layer 260 may include an oxide film or a nitride film, or may be include a double layer of an oxide film and a nitride film. The protective layer 260 may include an oxide layer through a high-density plasma chemical vapor deposition (HDP-CVD) process. For example, the oxide layer may include a silicon oxide layer (SiO2).

As illustrated in FIG. 23, the second lower silicon substrate 32 may be removed, and the third redistribution wiring layer 250 may be formed on the second lower surface 214 of the second upper silicon substrate 30. The third redistribution wiring layer 250 may include a third insulating layer and a third redistribution wire 254. The third redistribution wiring layer 250 may be formed to expose third bonding pads 252 from the third insulating layer.

For example, the third redistribution wire 254 may be formed in the third insulating layer. One end of the third redistribution wire 254 may be formed to contact the second chip pad 222 of the second semiconductor chip 220 or the third chip pad 242 of the third semiconductor chip 240. The other end of the third redistribution wire 254 may be formed to contact a third bonding pad 252. The third insulating layer may be formed to expose a lower surface of the third bonding pad 252 through the third opening.

After a seed layer is formed on a portion of the third insulating layer, the seed layer may be patterned to from the third redistribution wire 254 through an electroplating process. The third redistribution wire 254 may be formed to contact the third bonding pad 252 through the third opening. For example, the third redistribution wire may include aluminum (Al), copper (Cu), tin (Sn), nickel (Ni), gold (Au), platinum (Pt), or an alloy thereof.

The third bonding pad 252 may be formed on the third insulating layer, and may contact the third redistribution wire 254 through the third opening. Accordingly, the third bonding pad 252 may be formed to be exposed from the lower surface of the third insulating layer. For example, the third bonding pad 252 may include a metal material such as copper (Cu) or aluminum (Al).

After the protective layer 260 is formed on the second upper surface 212 of the second upper silicon substrate 30, the second semiconductor wafer W2 having a plurality of second sub packages 200 may be completed by forming the third redistribution wiring layer 250 on the second lower surface 214 of the second upper silicon substrate 30.

Figure 24:
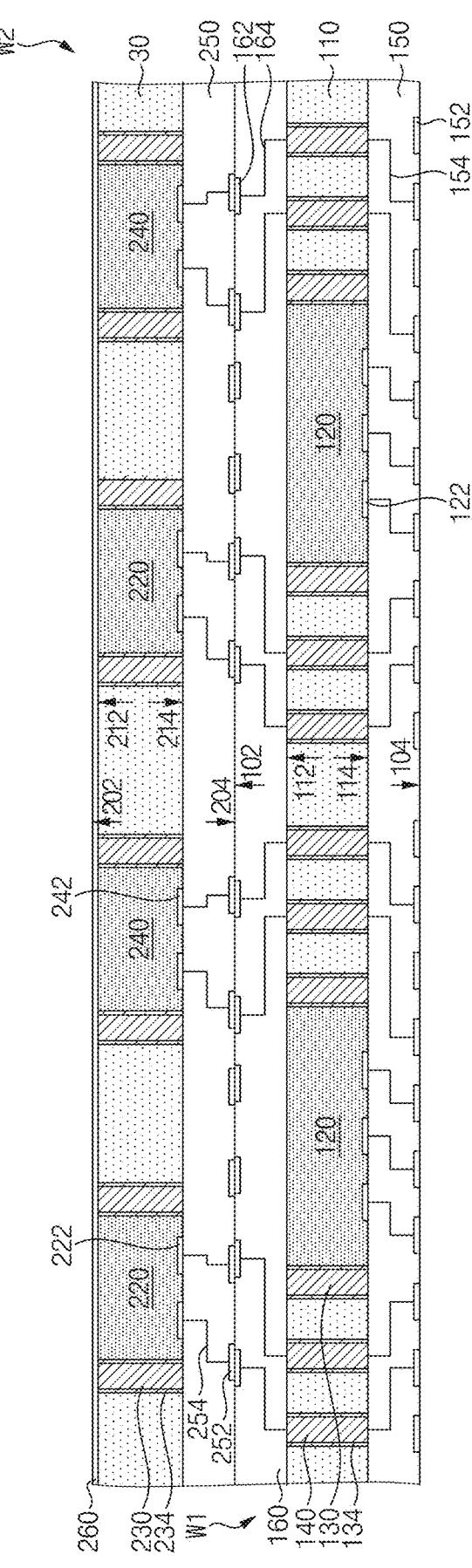
Figure 25:
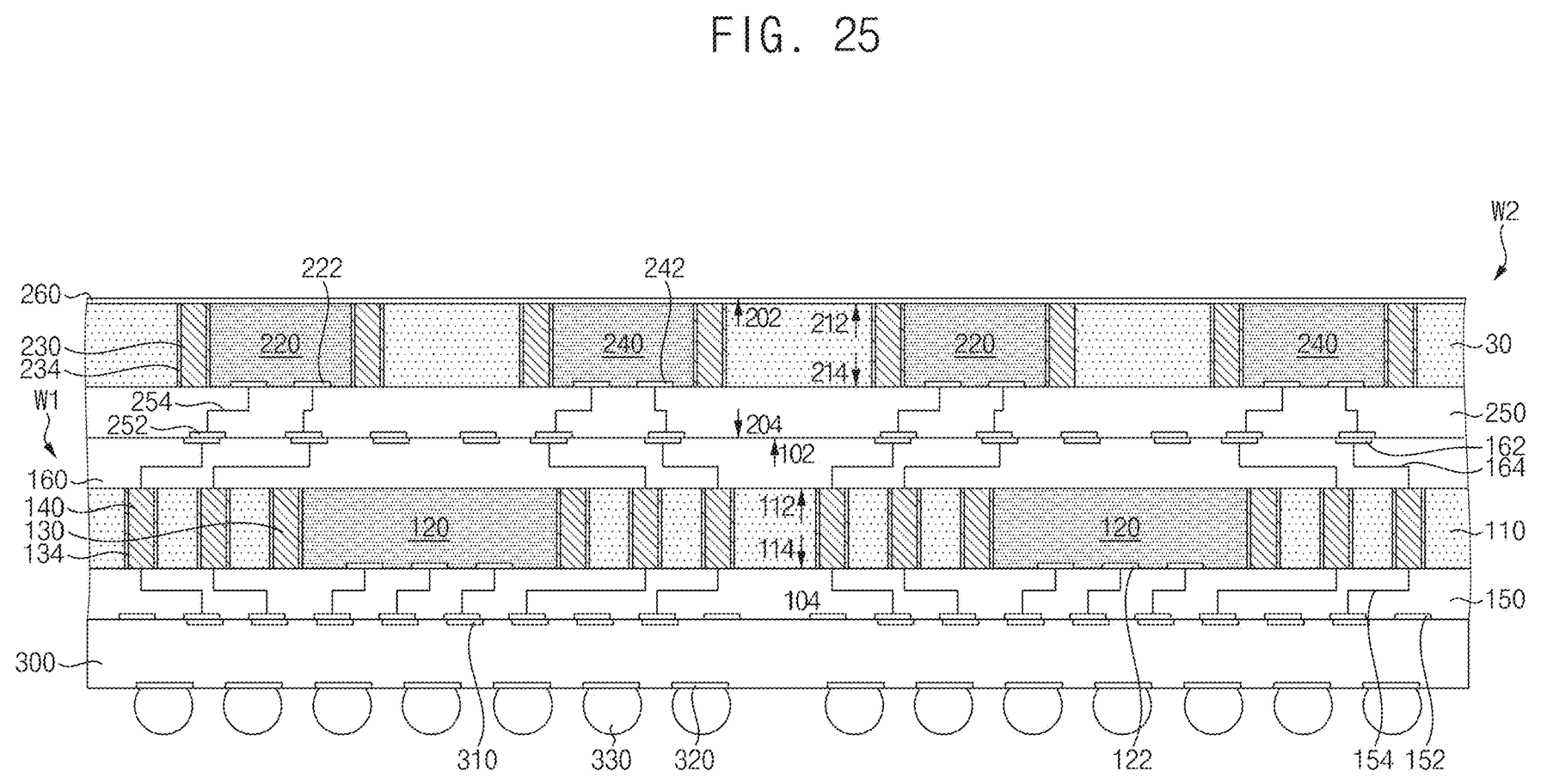
Figure 26:
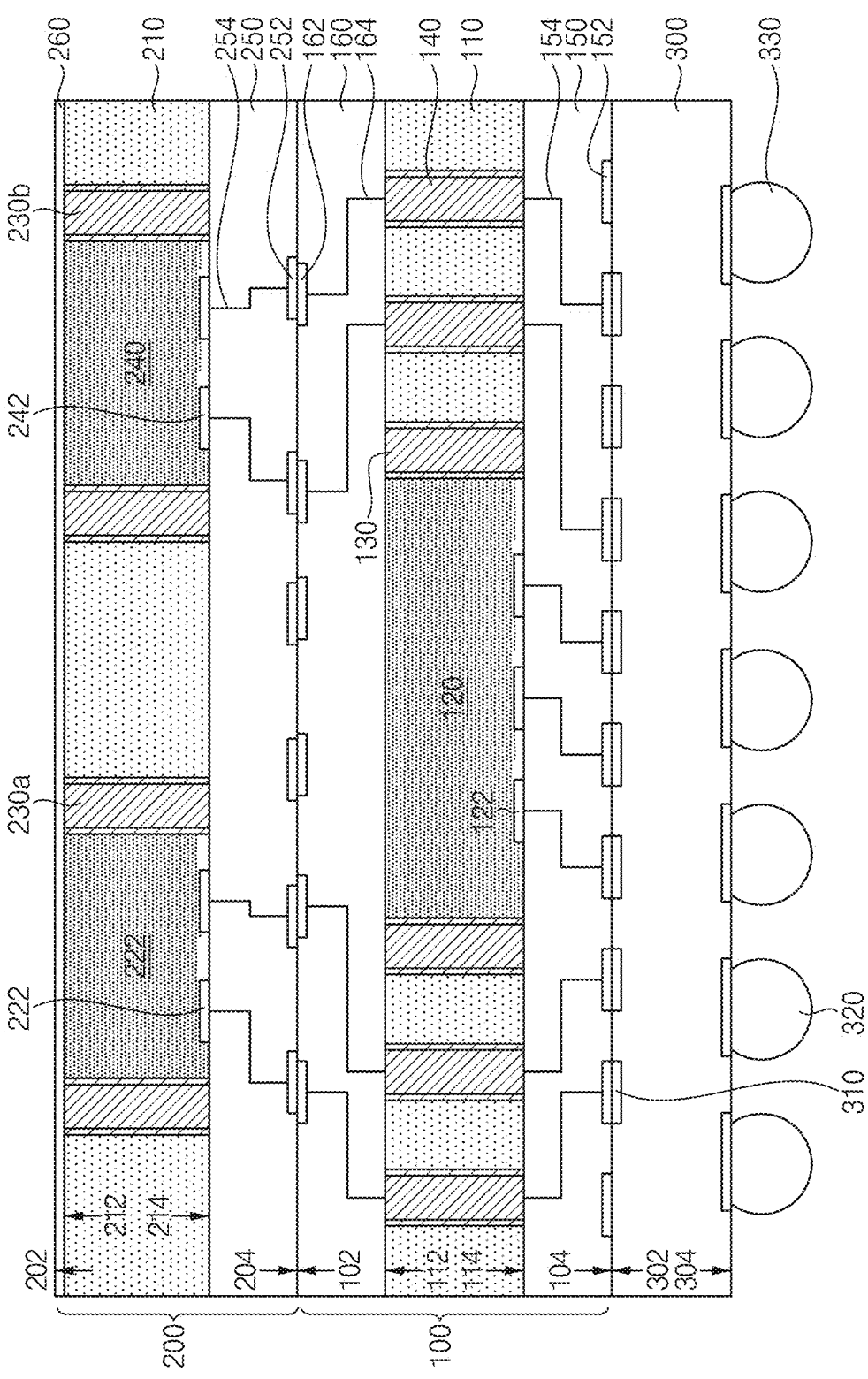

Referring to FIGS. 24 to 26, the first and second semiconductor wafers W1, W2 may be bonded to each other, a lower redistribution wiring layer 300 may be formed on the lower surface of the first semiconductor wafer W1, and the semiconductor package 10 may be formed by cutting the first and second semiconductor wafers W1, W2.

As illustrated in FIG. 24, the first and second semiconductor wafers W1, W2 may be bonded to each other such that the first surface 102 of the first sub package 100 and the fourth surface 204 of the second sub package 200 are bonded to each other. The first semiconductor wafer W1 and the second semiconductor wafer W2 may be bonded to each other. The first and second semiconductor wafers W1, W2 may be bonded to each other by wafer-wafer direct bonding.

The second bonding pads 162 of the second redistribution wiring layer 160 of the first sub package 100 may be connected to the third bonding pads 252 of the third redistribution wiring layer 250 of the second sub package 200. The second and third bonding pads 162, 252 may be electrically connected to each other.

The second insulating layer provided on the first surface 102 of the first sub package 100 and the third insulating layer provided on the fourth surface 204 of the second sub package 200 may be directly bonded to each other. Therefore, the second bonding pad 162 and the third bonding pad 252 between the first sub package 100 and the second sub package 200 may be bonded to each other by Cu—Cu Hybrid Bonding (pad to pad direct bonding).

As illustrated in FIG. 25, the lower redistribution wiring layer 300 may be formed on the second surface 104 of the first sub package 100.

The lower redistribution wiring layer 300 may have a third upper surface 302 and a third lower surface 304 opposite to each other. The lower redistribution wiring layer

300 may have a lower insulating layer and lower redistribution wires 340. The lower redistribution wiring layer 300 may be formed such that the first lower redistribution pads 310 are exposed from the third lower surface 304 and the second lower redistribution pads 320 are exposed from the third upper surface 302.

For example, the lower redistribution wire may be formed in the insulating layer. The lower redistribution wire may electrically connect the first and second lower redistribution pads 310, 320. One end of the lower redistribution wire may contact the first lower redistribution pad 310 and the other end of the lower redistribution wire may contact the second lower redistribution pad 320.

The first and second lower redistribution pads 310, 320 may be formed to be exposed from the lower insulating layer. The first lower redistribution pad 310 may be bonded to the first bonding pad 152 of the first sub package 100. For example, the first and second lower redistribution pads 310, 320 may include a metal material such as copper (Cu) or aluminum (Al).

Then, external connection bumps 330 such as solder balls may be formed on the second lower redistribution pads 320 of the lower redistribution wiring layer 300.

Then, the first and second semiconductor wafers W1, W2 and the lower redistribution wiring layer 300 may be cut along a scribe lane to form individual semiconductor packages 10. The first and second semiconductor wafers W1, W2 and the lower redistribution wiring layer 300 may be cut through a dicing process. The semiconductor package 10 including the first sub package 100 and the second sub package 200 may be completed by cutting the first and second semiconductor wafers W1, W2 and the lower redistribution wiring layer 300.

Figure 27:
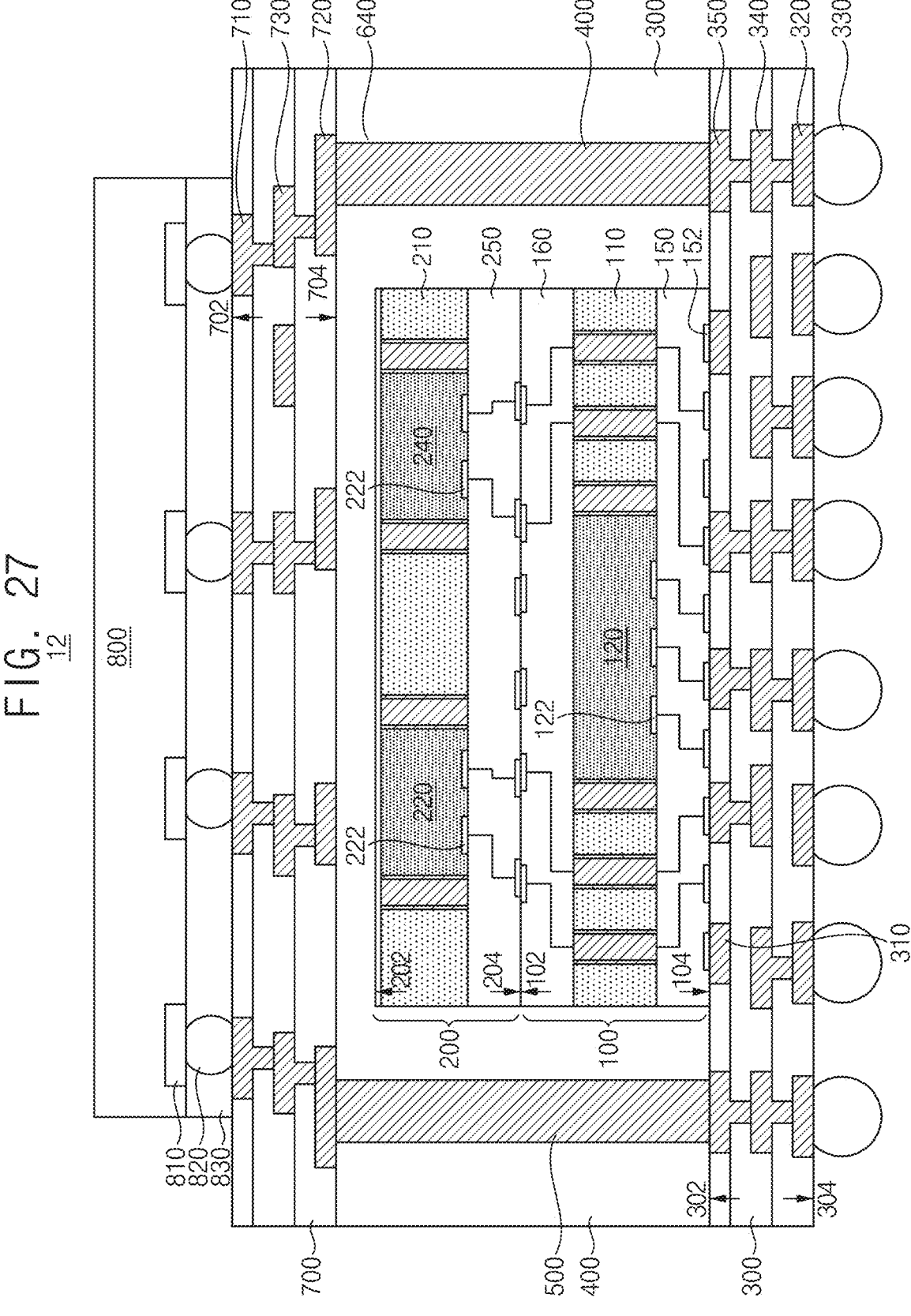

FIG. 27 is a cross-sectional view illustrating a semiconductor package including a conductive connector in accordance with example embodiments. The semiconductor package is the same or substantially the same as or similar to the semiconductor package described with reference to FIG. 1 except for the configuration of the lower redistribution wiring layer, a conductive connector, an upper redistribution wiring layer and a semiconductor device. Accordingly, the same or similar components are denoted by the same or similar reference numerals, and repeated descriptions of the same components will be omitted.

Referring to FIG. 27, a semiconductor package 12 may include the first semiconductor substrate 110, the first sub package 100 having the first and second redistribution wiring layers 150, 160, the second sub package 200 having the second semiconductor substrate 210 and the third redistribution wiring layer 250, the lower redistribution wiring layer 300 on which the first and second sub packages 100 and 200 are disposed, a conductive connector 500 provided on the lower redistribution wiring layer 300, a sealing member 400 covering the conductive connector 500 and the first and second sub packages 100, 200 on the lower redistribution wiring layer 300, an upper redistribution wiring layer 700 disposed on the sealing member, and/or a semiconductor device 800 disposed on the upper redistribution wiring layer 700.

In example embodiments, the lower redistribution wiring layer 300 may have a third upper surface 302 and a third lower surface 304 opposite to each other. The first and second sub packages 100, 200 may be disposed on the third upper surface 302 of the lower redistribution wiring layer 300.

The lower redistribution wiring layer 300 may include a plurality of lower redistribution wires 340 and lower insulating layers. The lower redistribution wiring layer 300 may include a plurality of first and third lower redistribution pads 310, 320, 350 that are provided to be exposed on the upper surface of the lower redistribution wiring layer 300, that is, the third upper surface 302. The lower redistribution wiring layer 300 may include a plurality of second lower redistribution pads 320 that are provided to be exposed on the lower surface of the lower redistribution wiring layer 300, that is, the third lower surface 304. The lower redistribution wire may be provided in the lower insulating layers. The lower redistribution wires 340 may electrically connect the first to third lower redistribution pads 310, 320, 350 to each other.

The first lower redistribution pads 310 may be provided in the lower insulating layer. The first lower redistribution pad 310 may contact the first bonding pads 152 of the first redistribution wiring layer 150 of the first sub package 100. The lower redistribution wiring layer 300 and the first sub package 100 may be bonded and electrically connected to each other via the first lower redistribution pad 310 of the lower redistribution wiring layer 300 and the first bonding pads 152 of the first sub package 100.

The second lower redistribution pads 320 may be provided in the lower insulating layer. The plurality of second lower redistribution pads 320 may be exposed from the lower surface of the lower redistribution wiring layer 300, that is, the third lower surface 304. The external connection bumps 330 may be provided on the second lower redistribution pads 320, respectively.

The third lower redistribution pads 350 may be provided in the lower insulating layer. A plurality of the third lower redistribution pads 350 may be provided to be exposed from the upper surface of the lower redistribution wiring layer 300, that is, the third upper surface 302. The conductive connectors 500 may be provided on the third lower redistribution pads 350, respectively.

In example embodiments, the sealing member 400 may cover the first and second sub packages 100, 200 and the conductive connector 500 on the lower redistribution wiring layer 300. The sealing member 400 may be provided on the lower redistribution wiring layer 300 to fill a space between the lower and upper redistribution wiring layers 300, 700.

The upper redistribution wiring layer 700 may be disposed on an upper surface of the sealing member 400. The sealing member 400 may have a parallel upper surface on which the upper redistribution wiring layer 700 is disposed. For example, the sealing member 400 may include an epoxy molding compound (EMC). The sealing member 400 may include UV resin, polyurethane resin, silicone resin, or silica filler.

In example embodiments, the conductive connector 500 may penetrate through the sealing member 400 in the vertical direction to electrically connect the lower redistribution wiring layer 300 and the upper redistribution wiring layer 700 to each other. The conductive connector 500 may extend from the lower redistribution wiring layer 300 in the same vertical direction as a thickness direction of the lower redistribution wiring layer 300.

For example, the conductive connector 500 may be electrically connected to the third lower redistribution pad 350 of the lower redistribution wiring layer 300. The conductive connector 500 may be electrically connected to the second upper redistribution pad 720 of the upper redistribution wiring layer 700. The conductive connector 500 may provide a signal movement path for electrically connecting the upper and lower redistribution wiring layers 300, 700.

In example embodiments, the upper redistribution wiring layer 700 may have a fourth upper surface 702 and a fourth lower surface 704 opposite to each other. The upper redistribution wiring layer 700 may include a plurality of first upper redistribution pads 710 that are exposed on the fourth upper surface 702 and a plurality of second upper redistribution pads 720 that are exposed on the fourth lower surface 704. The upper redistribution wiring layer 700 may be disposed on the upper surface of the sealing member 400. The semiconductor device 800 may be disposed on the upper redistribution wiring layer 700.

The upper redistribution wiring layer 700 may include a plurality of upper insulating layers and upper redistribution wires 730 provided in the upper insulating layers. The upper redistribution wires 730 may electrically connect the first and second upper redistribution pads 710, 720. The second upper redistribution pads 720 may contact and be electrically connected to the conductive connector 500.

In example embodiments, the semiconductor device 800 may be disposed on the upper redistribution wiring layer 700. The semiconductor device 800 may be mounted on the upper redistribution wiring layer 700 by a flip chip bonding method. In some example embodiments, the semiconductor device 800 may be mounted on the upper redistribution wiring layer 700 such that an active surface on which connection pads 810 are formed faces the upper redistribution wiring layer 700.

The connection pads 810 of the semiconductor device 800 may be electrically connected to the first upper redistribution pads 710 of the upper redistribution wiring layer 700 by conductive bumps 820 as conductive connection members. For example, the conductive bumps 820 may include micro bumps (uBumps).

An adhesive member 830 may be provided between the upper redistribution wiring layer 700 and the semiconductor device 800. For example, the adhesive member 830 may include an epoxy material.

Hereinafter, a method of manufacturing the semiconductor package in FIG. 27 will be described.

FIGS. 28 to 33 are views illustrating a method of manufacturing a semiconductor package in accordance with example embodiments.

Figure 28:
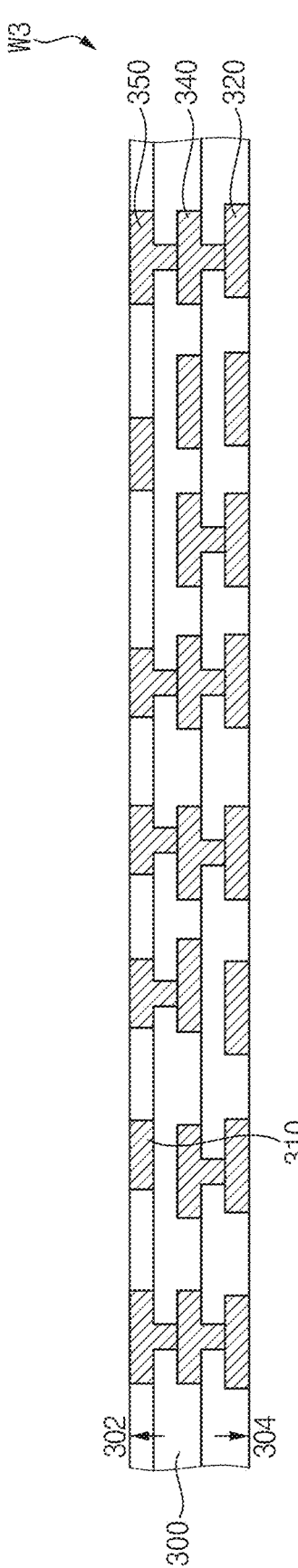

Referring to FIG. 28, a third semiconductor wafer W3 having lower redistribution wiring layers 300 may be provided on a carrier substrate.

The lower redistribution wiring layer 300 having first and second lower redistribution pads 310, 320 electrically connected by a lower redistribution wire 340 may be formed on the carrier substrate. The lower redistribution wire 340 may be formed in the lower insulating layer. For example, the lower insulating layer may include a polymer or a dielectric layer. For example, the lower insulating layer may include polyimide (PI), lead oxide (PbO), polyhydroxystyrene (PHS), NOVOLAC, and the like. The lower insulating layer may be formed by a vapor deposition process, a spin coating process, or the like.

After a seed layer is formed on a portion of the lower insulating layer, the seed layer may be patterned to from the lower redistribution wire 340 through an electroplating process. For example, the lower redistribution wire may include aluminum (Al), copper (Cu), tin (Sn), nickel (Ni), gold (Au), platinum (Pt), or an alloy thereof.

Figure 29:
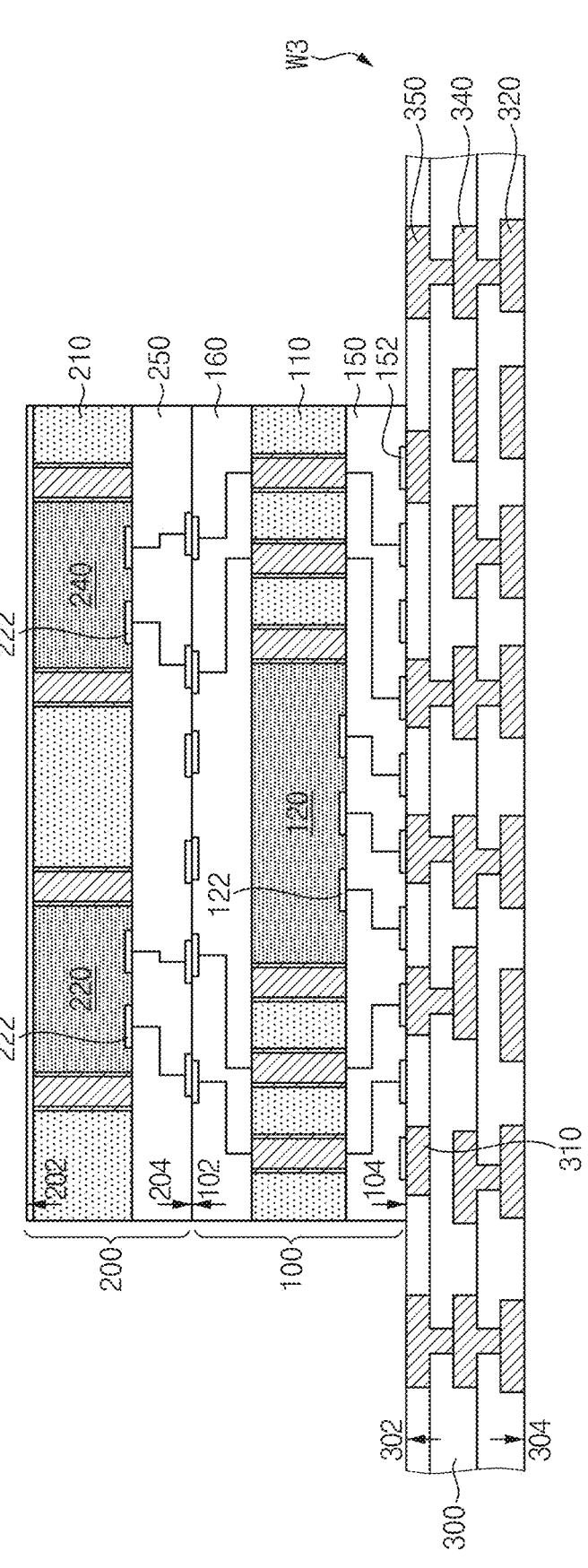
Figure 30:
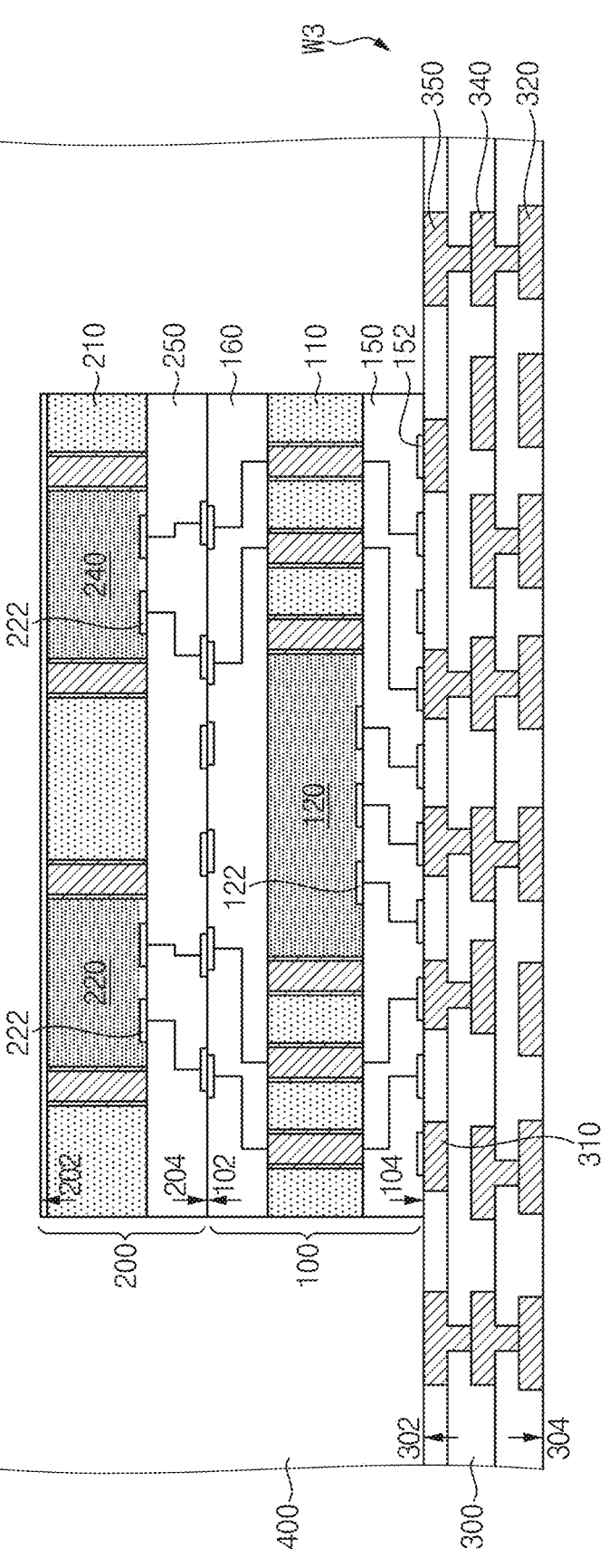

Referring to FIGS. 29 and 30, after the first and second sub packages 100, 200 are mounted on the lower redistribution wiring layer 300 of the third semiconductor wafer W3, a sealing member 400 covering the first and second sub packages 100, 200 may be formed on the lower redistribution wiring layer 300.

In example embodiments, the first bonding pad 152 and the first lower redistribution pad 310 may be bonded to each other between the first sub package 100 and the lower redistribution wiring layer 300 by Cu—Cu hybrid bonding (pad to pad direct bonding).

For example, the sealing member 400 may include an epoxy molding compound (EMC). The sealing member 400 may include UV resin, polyurethane resin, silicone resin, or silica filler.

Figure 31:
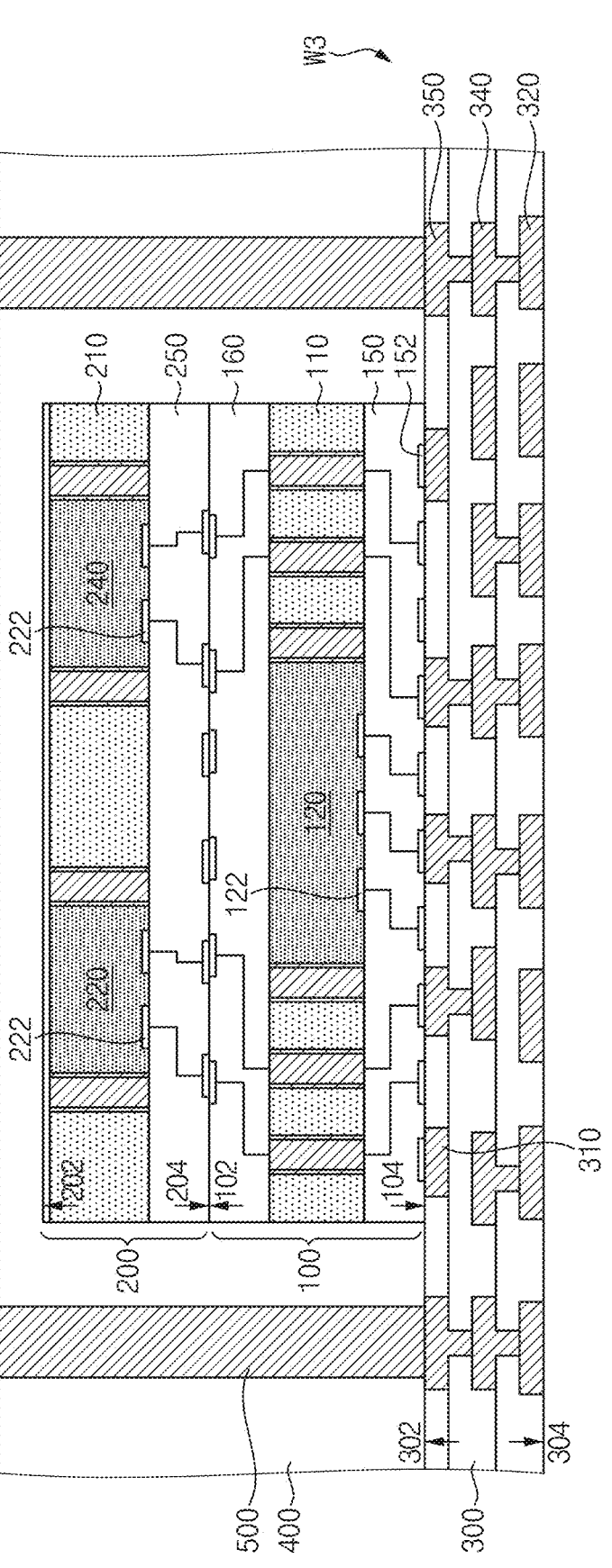

Referring to FIG. 31, a plurality of conductive connectors 500 penetrating the sealing member 400 in a vertical direction may be formed on the lower redistribution wiring layer 300.

First, an upper surface of the sealing member 400 may be covered through a third photoresist layer. Then, the exposure process may be performed on the third photoresist layer to form first through openings that expose the first lower redistribution pads 310, respectively.

The conductive connectors 500 may be formed on the first through openings that penetrate the third photoresist layer in the vertical direction. The conductive connectors 500 may be formed by performing a first plating process on the first through openings. For example, the conductive connector 500 may be formed by a plating process, an electroless plating process, a vapor deposition process, or the like. The conductive connector 500 may include a pillar shape, a bump shape, and the like.

Then, the third photoresist layer may be removed to form the conductive connectors 500 that extend from the first lower redistribution pads 310, respectively.

Figure 32:
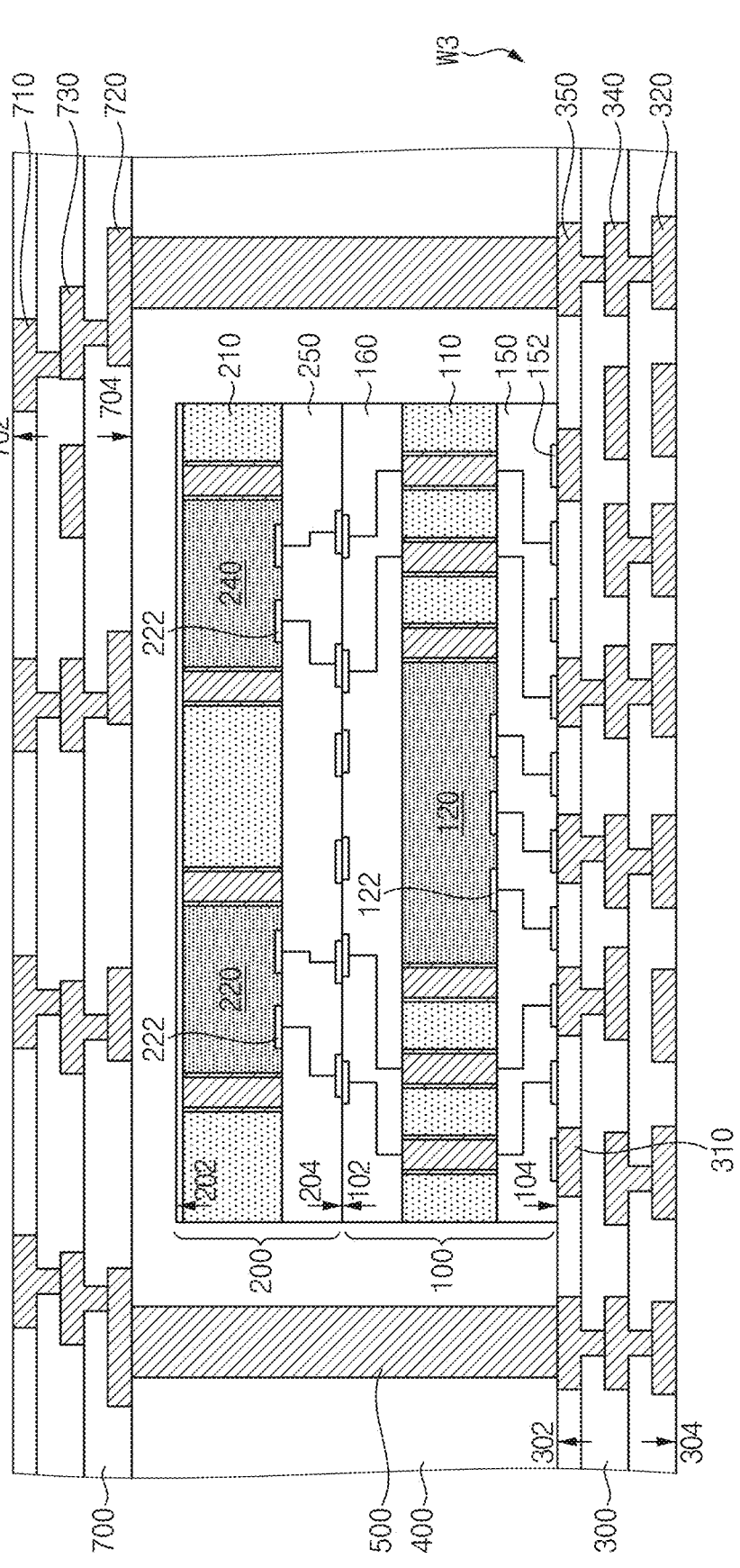

Referring to FIG. 32, processes the same as or similar to the processes described with reference to FIG. 28 may be performed on the third semiconductor wafer W3 to form an upper redistribution wiring layer 700.

The upper redistribution wiring layer 700 having first and second upper redistribution pads 710, 720 that are electrically connected by an upper redistribution wire 730 may be formed on the sealing member 400. The upper redistribution wire 730 may be formed in the upper insulating layer. For example, the upper insulating wire may include a polymer or a dielectric layer. For example, the upper insulating layer may include polyimide (PI), lead oxide (PbO), polyhydroxystyrene (PHS), novolac, or the like. The upper insulating layer may be formed by a vapor deposition process, a spin coating process, or the like.

After a seed layer is formed on a portion of the upper insulating layer, the seed layer may be patterned to form the upper redistribution wire 730 through an electroplating process. For example, the upper redistribution wire may include aluminum (Al), copper (Cu), tin (Sn), nickel (Ni), gold (Au), platinum (Pt), or an alloy thereof.

Figure 33:
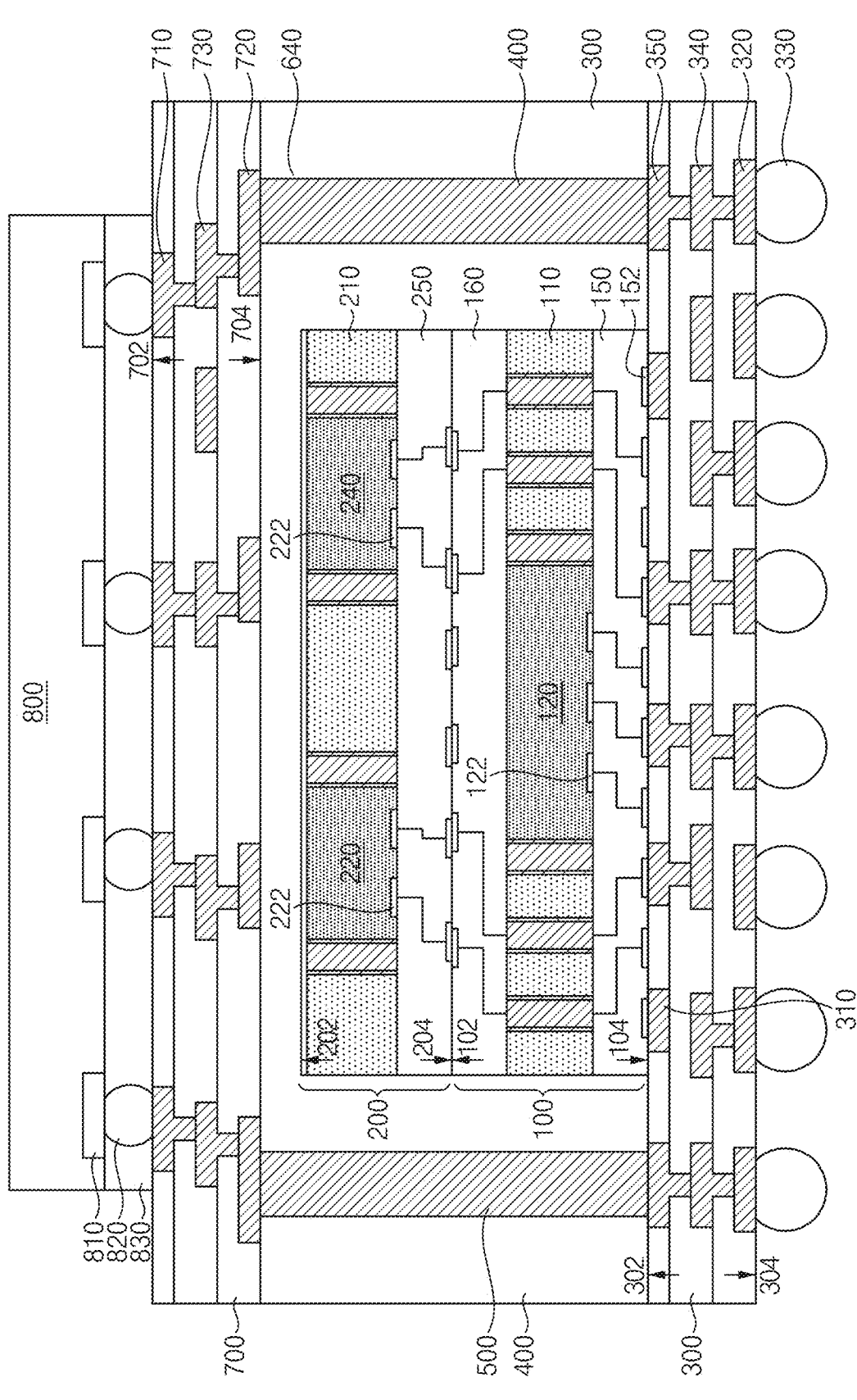

Referring to FIG. 33, external connection bumps 330 may be formed on the second lower redistribution pads 320 of the lower redistribution wiring layer 300, a semiconductor device 800 may be mounted on the upper redistribution wiring layer 700, and the third semiconductor wafer W3 may be cut to from the semiconductor package 12.

The external connection bump 330 may be formed on the second lower redistribution pad 320. For example, after a temporary opening of fourth photoresist pattern is filled with a conductive material, the fourth photoresist pattern may be removed and a reflow process may be performed to form the external connection bumps 330. For example, the conductive material may be formed by a plating process. Alternatively, the external connection bump 330 may be formed by a screen printing method, a deposition method, or the like. For example, the external connection bump 330 may include a C4 bump.

After the semiconductor device 800 is mounted on the upper redistribution wiring layer 700, an underfilled adhesive member 830 may be formed between the upper redistribution wiring layer 700 and the semiconductor device 800.

In example embodiments, the semiconductor device may be mounted on the upper redistribution wiring layer 700 by a flip chip bonding method. Connection pads 810 of the semiconductor device 800 may be electrically connected to the first upper redistribution pads 710 of the upper redistribution wiring layer 700 through the conductive bumps 820. For example, the conductive bumps 820 may include micro bumps (uBumps).

Then, the adhesive member 830 may be injected between the upper redistribution wiring layer 700 and the semiconductor device 800. For example, the adhesive member 830 may include an epoxy material to reinforce a gap between the upper redistribution wiring layer 700 and the semiconductor device 800.

Then, the semiconductor package 12 in FIG. 27 may be completed by cutting the third semiconductor wafer W3. The third semiconductor wafer W3 may be cut along a scribe lane region. The third semiconductor wafer W3 may be cut through a sawing process.

Figure 34:
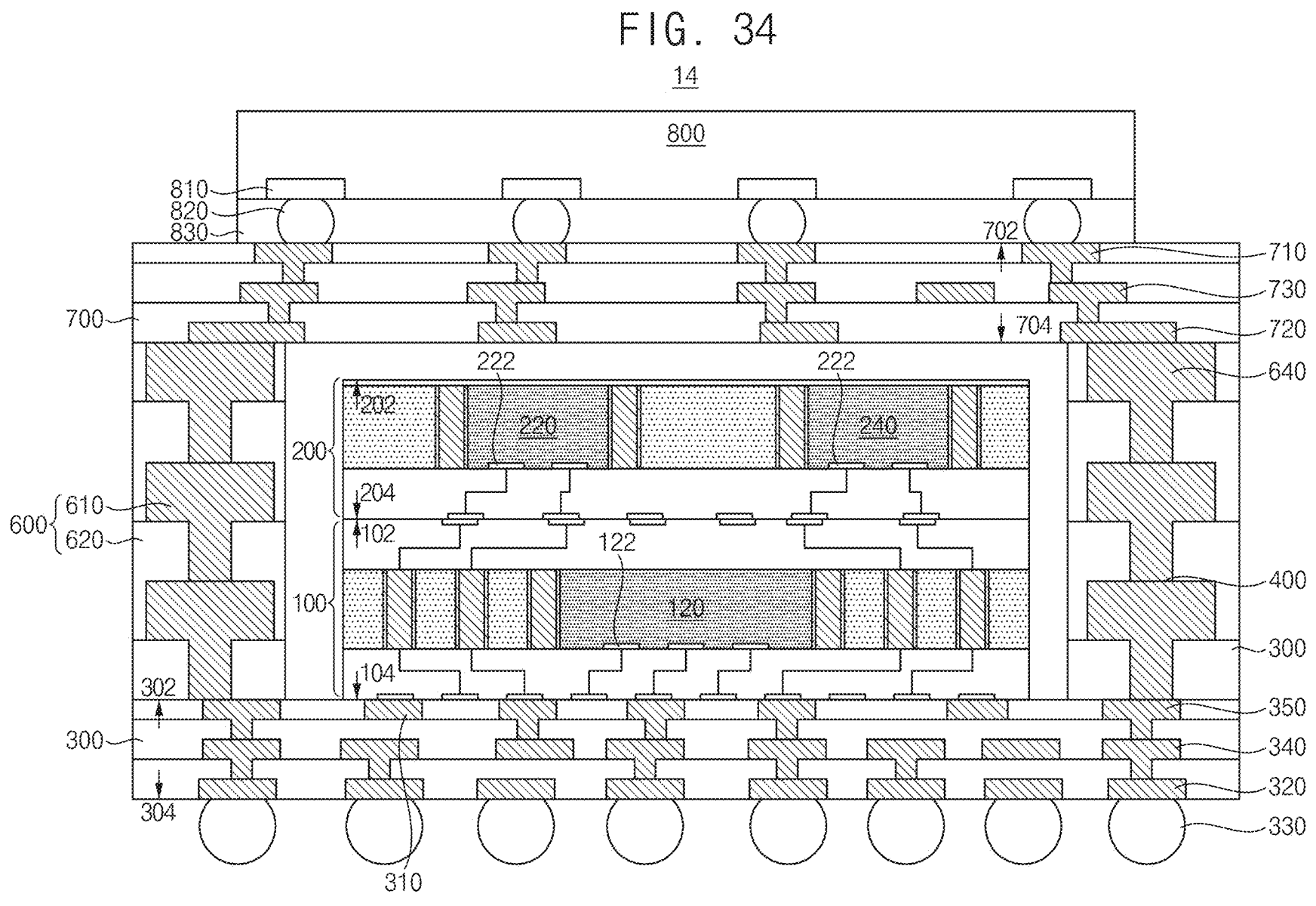

FIG. 34 is a cross-sectional view illustrating a semiconductor package including conductive wires in accordance with example embodiments. The semiconductor package is the same or substantially the same as or similar to the semiconductor package described with reference to FIG. 27 except for the configuration of conductive wires. Accordingly, the same or similar components are denoted by the same or similar reference numerals, and repeated descriptions of the same components will be omitted.

Referring to FIG. 34, a semiconductor package 14 may include the first semiconductor substrate 110, the first sub package 100 having first and second redistribution wiring layers 150, 160, the second sub package 200 having the second semiconductor substrate 210 and the third redistribution wiring layer 250, the lower redistribution wiring layer 300 on which the first and second sub packages 100, 200 are disposed, a conductive layer 600 provided on the lower redistribution wiring layer 300, the sealing member 400 covering the conductive layer 600 and the first and second sub packages 100, 200 on the lower redistribution wiring layer 300, the upper redistribution wiring layer 700 disposed on the sealing member, and the semiconductor device 800 disposed on the upper redistribution wiring layer 700.

In example embodiments, the conductive layer 600 may include a plurality of insulating layers 620 and conductive wires 610 that are provided in the insulating layers 620, respectively. The conductive layer 600 may electrically connect the lower redistribution wiring layer 300 and the upper redistribution wiring layer 700.

For example, the conductive wires 610 may be electrically connected to the third lower redistribution pad 350 of the lower redistribution wiring layer 300. The conductive wires 610 may be electrically connected to the second upper redistribution pad 720 of the upper redistribution wiring layer 700. The conductive wires 610 may provide a signal movement path for electrically connecting the upper and lower redistribution wiring layers 300, 700.

In example embodiments, the sealing member 400 may cover the first and second sub packages 100, 200 and the conductive layer 600 on the lower redistribution wiring layer 300. The sealing member 400 may be provided on the lower redistribution wiring layer 300 to fill a space between the lower and upper redistribution wiring layers 300, 700.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concepts. Accordingly, all such modifications are intended to be included within the scope of example embodiments as defined in the claims.

What is claimed is:

1. A semiconductor package, comprising:

a first redistribution wiring layer having a plurality of first redistribution wires, and a plurality of first bonding pads electrically connected to the plurality of first redistribution wires and exposed from a lower surface of the first redistribution wiring layer;

a first semiconductor substrate on a first upper surface of the first redistribution wiring layer, the first semiconductor substrate having at least one first semiconductor chip and through vias that are electrically connected to the plurality of first redistribution wires, and the first semiconductor substrate having a first heat dissipation structure surrounding a first outer surface of the at least one first semiconductor chip;

a second redistribution wiring layer on the first semiconductor substrate, and the second redistribution wiring layer having a plurality of second redistribution wires that are electrically connected to the through vias; and a second semiconductor substrate having at least one second semiconductor chip that is electrically connected to the plurality of second redistribution wires, and a second heat dissipation structure surrounding a second outer surface of the at least one second semiconductor chip, wherein each of the first semiconductor substrate and the second semiconductor substrate further includes a cavity in which the at least one first semiconductor chip or the at least one second semiconductor chip is accommodated, and each of the first heat dissipation structure and the second heat dissipation structure includes a liner film that covers an inner surface of the cavity and the first outer surface of the at least one first semiconductor chip and the second outer surface of the at least one second semiconductor chip, and a heat dissipation member in the liner film.

2. The semiconductor package of claim 1, wherein the second semiconductor substrate further includes at least one third semiconductor chip electrically connected to the plurality of second redistribution wires, and a third heat dissipation structure surrounding a third outer surface of the at least one third semiconductor chip.

3. The semiconductor package of claim 1, wherein the through vias include a first conductive material, and each of the first heat dissipation structure and the second heat dissipation structure includes a second conductive material identical to the first conductive material.

4. The semiconductor package of claim 3, wherein the first conductive material and the second conductive material include at least one selected from copper (Cu), aluminum (Al), tungsten (W), nickel (Ni), molybdenum (Mo), gold (Au), silver (Ag), chromium (Cr), tin (Sn) or titanium (Ti).

5. The semiconductor package of claim 1, wherein the second redistribution wiring layer further includes second and third bonding pads that are electrically connected to and bonded to at least some of the plurality of second redistribution wires.

6. The semiconductor package of claim 1, further comprising:

a first lower redistribution wiring layer on the lower surface of the first redistribution wiring layer, wherein the first lower redistribution wiring layer includes first lower redistribution pads, at least some of the first lower redistribution pads bonded to at least some of the plurality of first bonding pads, second lower redistribution pads exposed in an opposite direction to the first redistribution wiring layer, and external connection bumps on the second lower redistribution pads.

7. The semiconductor package of claim 6, further comprising:

a sealing member on the first lower redistribution wiring layer, and the sealing member covering the first redistribution wiring layer and the second redistribution wiring layer and the first semiconductor substrate and the second semiconductor substrate;

conductive connectors penetrating the sealing member in a vertical direction, and the conductive connectors extending from the first lower redistribution pads that are not bonded to the plurality of first bonding pads; and an upper redistribution wiring layer on a second upper surface of the sealing member, and the upper redistribution wiring layer having first upper redistribution pads provided on the conductive connectors.

8. The semiconductor package of claim 6, further comprising:

a conductive layer on the first lower redistribution wiring layer, the conductive layer having conductive wires electrically connected to the first lower redistribution pads that are not bonded to the plurality of first bonding pads, and insulating layers surrounding the conductive wires;

a sealing member on the first lower redistribution wiring layer, the sealing member covering a fourth outer surface of the first redistribution wiring layer and a fifth outer surface of the second redistribution wiring layer, the first semiconductor substrate and the second semiconductor substrate, and the conductive layer; and an upper redistribution wiring layer on a second upper surface of the sealing member, the upper redistribution wiring layer having first upper redistribution pads provided on the conductive wires.

9. The semiconductor package of claim 1, wherein the first heat dissipation structure and the second heat dissipation structure are electrically insulated from the at least one first semiconductor chip and the at least one second semiconductor chip, respectively.

10. A method of manufacturing a semiconductor package, the method comprising:

forming a first sub package having a first surface and a second surface opposed to each other;

forming a second sub package having a third surface and a fourth surface opposite to each other; and bonding third bonding pads exposed from the fourth surface of the second sub package to second bonding pads exposed from the first surface of the first sub package, wherein forming the first sub package includes, forming a plurality of first openings and at least one first cavity, the plurality of first openings vertically penetrating a first semiconductor substrate that has a first upper surface and a first lower surface opposed to each other, forming at least one first heat dissipation structure and through vias, the at least one first heat dissipation structure covering a first outer surface of at least one first semiconductor chip that is in the at least one first cavity, and the through vias into the plurality of first openings, respectively, forming a first redistribution wiring layer having first bonding pads on the first lower surface of the first semiconductor substrate such that the first bonding pads electrically connected to the at least one first semiconductor chip and the through vias through a plurality of first redistribution wires are exposed to the second surface, and forming a second redistribution wiring layer having the second bonding pads on the first upper surface of the first semiconductor substrate such that the second bonding pads electrically connected to the through vias through a plurality of second redistribution wires are exposed to the first surface, wherein forming the second sub package includes forming at least one second cavity penetrating a second semiconductor substrate in a vertical direction, the second semiconductor substrate having a second upper surface and a second lower surface opposite to each other, forming at least one second heat dissipation structure covering a second outer surface of at least one second semiconductor chip that is in the at least one second cavity, and forming a third redistribution wiring layer having the third bonding pads on the second lower surface of the second semiconductor substrate such that the third bonding pads electrically connected to the at least one second semiconductor chip through a plurality of third redistribution wires are exposed on the fourth surface, and wherein the forming the at least one first heat dissipation structure and the through vias further includes providing the at least one first semiconductor chip within the at least one first cavity, forming the through vias by injecting a first conductive material into the plurality of first openings, forming the at least one first heat dissipation structure by injecting the first conductive material between the at least one first cavity and the at least one first semiconductor chip, and forming a liner film on the first outer surface of the at least one first semiconductor chip.

11. The method of claim 10, wherein the forming the through vias further includes forming the liner film on an inner surface of the at least one first cavity.

12. The method of claim 10, wherein the forming the at least one second heat dissipation structure further includes:

providing the at least one second semiconductor chip within the at least one second cavity; and forming the at least one second heat dissipation structure by injecting a second conductive material between the at least one second cavity and the at least one second semiconductor chip.

13. The method of claim 10, wherein the forming the first sub package further includes:

forming at least one third cavity penetrating the second semiconductor substrate in the vertical direction;

forming at least one third heat dissipation structure covering a third outer surface of at least one third semiconductor chip that is in the at least one third cavity; and forming the third redistribution wiring layer such that the at least one third semiconductor chip and the plurality of third redistribution wires are electrically connected to each other.

14. The method of claim 10, wherein the through vias and the at least one first heat dissipation structure and the at least one second heat dissipation structure include at least one selected from copper (Cu), aluminum (Al), tungsten (W), nickel (Ni), molybdenum (Mo), gold (Au), silver (Ag), chromium (Cr), tin (Sn) or titanium (Ti).

15. The method of claim 10, the method further comprising:

forming a lower redistribution wiring layer electrically connected to the first bonding pads on the second surface of the first sub package.

16. The method of claim 15, the method further comprising:

covering the first sub package and the second sub package on the lower redistribution wiring layer with a sealing member;

forming conductive connectors that penetrate the sealing member in the vertical direction from the lower redistribution wiring layer; and forming a second substrate electrically connected to the lower redistribution wiring layer through the conductive connectors on a third upper surface of the sealing member.

17. The method of claim 15, the method further comprising:

forming a conductive layer on the lower redistribution wiring layer, the conductive layer having conductive wires that are electrically connected to the lower redistribution wiring layer, and insulating layers surrounding the conductive wires;

covering the conductive layer and the first sub package and the second sub package on the lower redistribution wiring layer through a sealing member; and forming a second substrate electrically connected to the lower redistribution wiring layer through the conductive wires on a third upper surface of the sealing member.

18. A method of manufacturing a semiconductor package, the method comprising:

forming a first sub package having a first surface and a second surface opposed to each other;

forming a second sub package having a third surface and a fourth surface opposite to each other; and bonding third bonding pads exposed from the fourth surface of the second sub package to second bonding pads exposed from the first surface of the first sub package, wherein forming the first sub package includes forming a plurality of first openings and at least one first cavity, the plurality of first openings vertically penetrating a first semiconductor substrate that has a first upper surface and a first lower surface opposed to each other, forming at least one first heat dissipation structure and through vias, the at least one first heat dissipation structure covering a first outer surface of at least one first semiconductor chip that is in the at least one first cavity, and the through vias into the plurality of first openings, respectively, forming a first redistribution wiring layer having first bonding pads on the first lower surface of the first semiconductor substrate such that the first bonding pads electrically connected to the at least one first semiconductor chip and the through vias through a plurality of first redistribution wires are exposed to the second surface, and forming a second redistribution wiring layer having the second bonding pads on the first upper surface of the first semiconductor substrate such that the second bonding pads electrically connected to the through vias through a plurality of second redistribution wires are exposed to the first surface, wherein the forming the second sub package includes forming at least one second cavity penetrating a second semiconductor substrate in a vertical direction, the second semiconductor substrate having a second upper surface and a second lower surface opposite to each other, forming at least one second heat dissipation structure covering a second outer surface of at least one second semiconductor chip that is accommodated in the at least one second cavity, and forming a third redistribution wiring layer having the third bonding pads on the second lower surface of the second semiconductor substrate such that the third bonding pads electrically connected to the at least one second semiconductor chip through a plurality of third redistribution wires are exposed on the fourth surface, wherein the forming the at least one first heat dissipation structure and the through vias further includes providing the at least one first semiconductor chip in the at least one first cavity, forming the through vias by injecting a first conductive material into the plurality of first openings, forming the at least one first heat dissipation structure by injecting the first conductive material between the at least one first cavity and the at least one first semiconductor chip, and forming a liner film on the first outer surface of the at least one first semiconductor chip, wherein the forming the second heat dissipation structure further includes providing the at least one second semiconductor chip in the at least one second cavity, and forming the at least one second heat dissipation structure by injecting a second conductive material between the at least one second cavity and the at least one second semiconductor chip, and wherein the at least one first heat dissipation structure and the at least one second heat dissipation structure are electrically insulated from the at least one first semiconductor chip and the at least one second semiconductor chip.

* * * * *